US 9,082,594 B2

(12) United States Patent
Valcore, Jr. et al.

(10) Patent No.: US 9,082,594 B2
(45) Date of Patent: Jul. 14, 2015

(54) ETCH RATE MODELING AND USE THEREOF FOR IN-CHAMBER AND CHAMBER-TO-CHAMBER MATCHING

(71) Applicant: Lam Research Corporation, Fremont, CA (US)

(72) Inventors: John C. Valcore, Jr., Berkeley, CA (US); Harmeet Singh, Fremont, CA (US); Henry Povolny, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/317,360

(22) Filed: Jun. 27, 2014

(65) Prior Publication Data

US 2015/0028744 A1 Jan. 29, 2015

Related U.S. Application Data

(63) Continuation of application No. 14/243,705, filed on Apr. 2, 2014.

(60) Provisional application No. 61/858,985, filed on Jul. 26, 2013.

(51) Int. Cl.
*H01J 7/24* (2006.01)
*H01J 31/26* (2006.01)
(Continued)

(52) U.S. Cl.
CPC ......... *H01J 37/32926* (2013.01); *G05B 19/418* (2013.01); *H01J 37/3299* (2013.01); *H01J 37/32183* (2013.01); *H01J 37/32935* (2013.01)

(58) Field of Classification Search
CPC ....... H01J 7/24; H01J 31/26; H01J 37/32183; H01J 37/32926; H01J 37/32935; H01J 37/3299; G05B 19/418

USPC ............ 315/111.01, 111.21, 111.41, 111.51, 315/111.71; 156/345.21, 345.28, 345.48
See application file for complete search history.

(56) References Cited

U.S. PATENT DOCUMENTS

| 4,377,961 A | 3/1983 | Bode |
| 4,420,790 A | 12/1983 | Golke et al. |

(Continued)

FOREIGN PATENT DOCUMENTS

| JP | 2001-127045 A | 5/2001 |
| JP | 2004239211 A | 8/2004 |

(Continued)

OTHER PUBLICATIONS

Thorsten, Lill et al, "Controlling ION Energy Within a Plasma Chamber", U.S. Appl. No. 13/930,138, filed Jun. 28, 2013.

(Continued)

*Primary Examiner* — Jimmy Vu
(74) *Attorney, Agent, or Firm* — Martine Penilla Group, LLP

(57) ABSTRACT

A method for performing chamber-to-chamber matching includes receiving a voltage and a current measured at an output of an RF generator of a first plasma system. The method further includes calculating a sum of terms. The first term is a first product of a coefficient and a function of the voltage. The second term is a second product of a coefficient and a function of the current. The third term is a third product of a coefficient, a function of the voltage, and a function of the current. The method further includes determining the sum to be the etch rate associated with the first plasma system and adjusting power output from an RF generator of a second plasma system to achieve the etch rate associated with the first plasma system.

20 Claims, 10 Drawing Sheets

(51) Int. Cl.
*H01J 37/32* (2006.01)
*G05B 19/418* (2006.01)

(56) References Cited

U.S. PATENT DOCUMENTS

| | | | |
|---|---|---|---|
| 4,500,563 A | 2/1985 | Ellenberger et al. |
| 5,474,648 A | 12/1995 | Patrick et al. |
| 5,479,340 A | 12/1995 | Fox et al. |
| 5,556,549 A | 9/1996 | Patrick et al. |
| 5,689,215 A | 11/1997 | Richardson et al. |
| 5,737,177 A | 4/1998 | Mett et al. |
| 5,764,471 A | 6/1998 | Burkhart |
| 5,810,963 A | 9/1998 | Tomioka |
| 5,812,361 A | 9/1998 | Jones et al. |
| 5,866,985 A | 2/1999 | Coultas et al. |
| 5,889,252 A | 3/1999 | Williams et al. |
| 5,892,198 A | 4/1999 | Barnes et al. |
| 5,894,400 A | 4/1999 | Graven et al. |
| 5,980,767 A | 11/1999 | Koshimizu et al. |
| 6,020,794 A | 2/2000 | Wilbur |
| 6,042,686 A | 3/2000 | Dible et al. |
| 6,048,435 A | 4/2000 | DeOrnelias et al. |
| 6,110,214 A | 8/2000 | Klimasauskas |
| 6,198,616 B1 | 3/2001 | Dahimene et al. |
| 6,246,972 B1 | 6/2001 | Klimasauskas |
| 6,472,822 B1 | 10/2002 | Chen et al. |
| 6,522,121 B2 | 2/2003 | Coumou |
| 6,535,785 B2 | 3/2003 | Johnson et al. |
| 6,597,002 B1 | 7/2003 | Kondo |
| 6,669,783 B2 | 12/2003 | Sexton et al. |
| 6,677,246 B2 | 1/2004 | Scanlan et al. |
| 6,750,711 B2 | 6/2004 | Chawla et al. |
| 6,823,815 B2 | 11/2004 | Han et al. |
| 6,838,635 B2 | 1/2005 | Hoffman et al. |
| 6,862,557 B2 | 3/2005 | Jones et al. |
| 6,873,114 B2 | 3/2005 | Avoyan et al. |
| 6,972,524 B1 | 12/2005 | Marakhtanov et al. |
| 6,983,215 B2 | 1/2006 | Coumou et al. |
| 7,042,311 B1 | 5/2006 | Hilliker et al. |
| 7,122,965 B2 | 10/2006 | Goodman |
| 7,169,625 B2 | 1/2007 | Davis et al. |
| 7,323,116 B2 | 1/2008 | Guiney et al. |
| 7,359,177 B2 | 4/2008 | Yang et al. |
| 7,375,038 B2 | 5/2008 | Kumar |
| 7,435,926 B2 | 10/2008 | Jafarian-Tehrani |
| 7,459,100 B2 | 12/2008 | Kiemasz et al. |
| 7,480,571 B2 | 1/2009 | Howald et al. |
| 7,505,879 B2 | 3/2009 | Tomoyasu et al. |
| 7,728,602 B2 | 6/2010 | Valcore et al. |
| 7,768,269 B2 | 8/2010 | Piptone et al. |
| 7,858,898 B2 | 12/2010 | Bailey, III et al. |
| 7,967,944 B2 | 6/2011 | Shannon et al. |
| 8,040,068 B2 | 10/2011 | Coumou et al. |
| 8,080,168 B2 | 12/2011 | Cirigliano |
| 8,080,760 B2 | 12/2011 | Dhindsa et al. |
| 8,264,238 B1 | 9/2012 | El-Chouelry |
| 8,271,121 B2 | 9/2012 | Venugopal et al. |
| 8,368,308 B2 | 2/2013 | Banna et al. |
| 8,404,598 B2 | 3/2013 | Liao et al. |
| 8,501,631 B2 | 8/2013 | Valcore et al. |
| 8,901,935 B2 | 12/2014 | Valcore et al. |
| 2003/0082835 A1 | 5/2003 | McChesney et al. |
| 2003/0103793 A1 | 6/2003 | Murakoshi et al. |
| 2004/0028837 A1 | 2/2004 | Fink |
| 2004/0045506 A1 | 3/2004 | Chen et al. |
| 2004/0060660 A1 | 4/2004 | Klimechy et al. |
| 2004/0061448 A1 | 4/2004 | Avoyan et al. |
| 2004/0087047 A1 | 5/2004 | Jaiswal et al. |
| 2004/0107906 A1 | 6/2004 | Collins et al. |
| 2004/0135590 A1 | 7/2004 | Quon |
| 2004/0222184 A1 | 11/2004 | Hayami et al. |
| 2004/0226657 A1 | 11/2004 | Hoffman |
| 2005/0090118 A1 | 4/2005 | Shannon et al. |
| 2005/0133163 A1 | 6/2005 | Shannon et al. |
| 2005/0134186 A1 | 6/2005 | Brouk et al. |
| 2005/0151479 A1 | 7/2005 | Avoyan et al. |
| 2005/0217797 A1 | 10/2005 | Jafarian-Tehrani |
| 2005/0241762 A1 | 11/2005 | Paterson et al. |
| 2005/0252884 A1 | 11/2005 | Lam et al. |
| 2006/0065623 A1 | 3/2006 | Guiney et al. |
| 2006/0065631 A1 | 3/2006 | Cheng et al. |
| 2006/0065632 A1 | 3/2006 | Cheng et al. |
| 2006/0088655 A1 | 4/2006 | Collins et al. |
| 2006/0100824 A1 | 5/2006 | Moriya |
| 2006/0169582 A1 | 8/2006 | Brown et al. |
| 2006/0231526 A1 | 10/2006 | Donohue |
| 2006/0232471 A1 | 10/2006 | Coumou |
| 2007/0021935 A1 | 1/2007 | Larson et al. |
| 2007/0065594 A1 | 3/2007 | Chiang et al. |
| 2007/0127188 A1* | 6/2007 | Yang et al. .......... 361/234 |
| 2007/0247074 A1 | 10/2007 | Paterson et al. |
| 2007/0252580 A1 | 11/2007 | Dine et al. |
| 2007/0262723 A1 | 11/2007 | Ikenouchi |
| 2009/0151871 A1 | 6/2009 | Pease et al. |
| 2009/0284156 A1 | 11/2009 | Banna et al. |
| 2009/0294061 A1 | 12/2009 | Shannon et al. |
| 2009/0295296 A1 | 12/2009 | Shannon et al. |
| 2010/0099266 A1 | 4/2010 | Oswald et al. |
| 2010/0270141 A1 | 10/2010 | Carter et al. |
| 2011/0031216 A1 | 2/2011 | Liao et al. |
| 2011/0097901 A1 | 4/2011 | Banna et al. |
| 2011/0115492 A1 | 5/2011 | Valcore, Jr. et al. |
| 2011/0118863 A1 | 5/2011 | Valcore, Jr. |
| 2011/0137446 A1 | 6/2011 | Valcore, Jr. et al. |
| 2012/0073754 A1 | 3/2012 | De la Llera et al. |

FOREIGN PATENT DOCUMENTS

| | | |
|---|---|---|
| JP | 2004-335594 A | 11/2004 |
| JP | 2005130198 | 5/2005 |
| JP | 2005284046 A | 10/2005 |
| KR | 10-2005-0088438 A | 9/2005 |
| KR | 10-2005-0089995 A | 9/2005 |
| KR | 10-2007-0031915 A | 3/2007 |
| WO | 2008002938 A2 | 1/2008 |
| WO | 2012054306 A2 | 4/2012 |

OTHER PUBLICATIONS

"Electromagnetic Waves and Antennas", Sophocles J. Orfanidis, Rutgers University, Aug. 25, 2013, Chapter 10.10.

Damon et al., "Synchronous Pulsed Plasma for Silicon Etch Applications", ECS Transactions, 27 (1) pp. 717-723 (2010), Publication by: The Electrochemical Society.

PCT/US2010/057478 International Search Report and Written Opinion, mailed Jul. 26, 2011 (6 pages).

PCT/US2011/063422 International Search Report and Written Opinion, mailed Mar. 28, 2012 (9 pages).

PCT/US2010/057450 International Search Report and Written Opinion, mailed Jul. 18, 2011 (9 pages).

PCT/IB2013/051010 International Search Report and Written Opinion, mailed Jul. 3, 2013 (13 pages).

* cited by examiner

ETCH RATE MODELING AND USE THEREOF FOR IN-CHAMBER AND CHAMBER-TO-CHAMBER MATCHING

CROSS-REFERENCE TO RELATED APPLICATIONS

This application is related to U.S. patent application Ser. No. 14/243,705, filed on Apr. 2, 2014, and titled "Etch Rate Modeling and Use Thereof With Multiple Parameters For In-chamber and Chamber-to-Chamber Matching", which is incorporated by reference herein in its entirety.

CLAIM OF PRIORITY

The present patent application is a continuation of and claims the benefit of and priority, under 35 U.S.C. §120, to U.S. patent application Ser. No. 14/243,705, filed on Apr. 2, 2014, and titled "Etch Rate Modeling and Use Thereof With Multiple Parameters For In-chamber and Chamber-to-Chamber Matching", which claims the benefit of and priority, under 35 U.S.C. §119(e), to U.S. Provisional Patent Application No. 61/858,985, filed on Jul. 26, 2013, and titled "Etch Rate Modeling and Use Thereof For In-chamber and Chamber-to-Chamber Matching", both of which are incorporated by reference herein in their entirety for all purposes.

The present patent application claims the benefit of and priority, under 35 U.S.C. §119(e), to U.S. Provisional Patent Application No. 61/858,985, filed on Jul. 26, 2013, and titled "Etch Rate Modeling and Use Thereof For In-chamber and Chamber-to-Chamber Matching", which is incorporated by reference herein in its entirety for all purposes.

FIELD

The present embodiments relate to etch rate modeling and use of the model for in-chamber matching and chamber-to-chamber matching.

BACKGROUND

Plasma chambers are used for a variety of processes, e.g., cleaning a wafer, depositing materials on a wafer, etc. Plasma is used to perform the processes. For example, a radio frequency (RF) generator generates an RF signal to transfer to a plasma chamber to generate plasma within the plasma chamber. The RF generator may be a 2 megahertz (MHz) RF generator, a 27 MHz RF generator, or a 60 MHz RF generator.

Another one of the processes includes etching a wafer. However, when a wafer is etched in a plasma chamber, rate of etching the wafer varies over time within the plasma chamber. For example, there is an 0.85% etch rate change when the 27 MHz RF generator is used to supply RF power to a plasma chamber to etch a wafer. As another example, there is a 1.08% etch rate change when the 60 MHz RF generator is used to supply RF power to a plasma chamber to etch a wafer.

Moreover, when a wafer is etched in multiple plasma chambers, different etch rates may be applied on the wafer. For example, there may be a 3.3% variability in etch rate chamber-to-chamber when the 27 MHz RF generator is used to supply RF power to a plasma chamber to etch a wafer. As another example, there may be a 4.8% variability in an etch rate chamber-to-chamber when the 60 MHz RF generator is used to supply RF power to a plasma chamber to etch a wafer.

It is in this context that embodiments described in the present disclosure arise.

SUMMARY

Embodiments of the disclosure provide apparatus, methods and computer programs for etch rate modeling and use of the model for in-chamber matching and chamber-to-chamber matching. It should be appreciated that the present embodiments can be implemented in numerous ways, e.g., a process, an apparatus, a system, a device, or a method on a computer-readable medium. Several embodiments are described below.

In some embodiments, an etch rate is modeled to facilitate chamber-to-chamber matching and/or in-chamber matching of etch rates. For example, an etch rate is determined as a function of coefficients and voltages and/or currents. The determined etch rate is used to maintain a constant etch rate for a plasma system or across multiple plasma systems.

In various embodiments, a method for performing chamber-to-chamber matching of etch rates based on an etch rate model is described. The method includes receiving a voltage and a current measured at an output of a radio frequency (RF) generator of a first plasma system and calculating a sum of a first term, a second term, and a third term. The first term is a first product of a coefficient and a function of the voltage, the second term is a second product of a coefficient and a function of the current, and the third term is a third product of a coefficient, a function of the voltage, and a function of the current. The method further includes determining the sum to be the etch rate associated with the first plasma system, and adjusting power output from an RF generator of a second plasma system to achieve the etch rate associated with the first plasma system. The method is executed by a processor.

In several embodiments, a method for performing in-chamber matching of etch rates based on an etch rate model is described. The method includes receiving a voltage and a current measured at a first time at an output of an RF generator of a plasma system and calculating a sum of a first term, a second term, and a third term. The first term is a first product of a coefficient and a function of the voltage, the second term is a second product of a coefficient and a function of the current, and the third term is a third product of a coefficient, a function of the voltage, and a function of the current. The method further includes determining the sum to be the etch rate associated with the plasma system, and adjusting power output at a second time from the RF generator of the plasma system to achieve the etch rate. The method is executed by a processor.

In some embodiments, a plasma system for modeling an etch rate is described. The first plasma system includes an RF generator for generating an RF signal. The RF generator includes an output for facilitating transfer of the RF signal. The first plasma system further includes a complex impedance sensor coupled to the output for measuring a complex voltage and current of the RF signal, a plasma chamber for generating plasma when the RF signal is received, and an impedance matching circuit coupled to the RF generator via a cable and coupled to the plasma chamber via an RF transmission line. The first plasma system includes a processor coupled to the complex impedance sensor for receiving the measurement of the complex voltage and current from the complex impedance sensor. The processor is used for receiving a voltage and a current measured at an output of an RF generator of a second plasma system and calculating a sum of a first term, a second term, and a third term. The first term is a first product of a coefficient and a function of the voltage measured at the output of the RF generator of the second plasma system. The second term is a second product of a coefficient and a function of the current measured at the output of the RF generator of the second plasma system. The third term is a third product of a coefficient, a function of the voltage measured at the output of the RF generator of the second plasma system, and a function of the current measured at the output of the RF generator of the second plasma system. The processor is further used for determining the sum to be the etch rate associated with the second plasma system, and adjusting power measured at the output of the RF generator of the first plasma system to achieve the etch rate associated with the second plasma system. The adjustment of power is done based on the complex voltage and current.

Some advantages of the above-described embodiments include providing a model of an etch rate. For example, the etch rate is determined as a function of coefficients and voltages and/or currents. As another example, the etch rate is determined as a sum of products of coefficients and functions of a voltage, or functions of a current, or a combination of functions of the voltage and functions of the current. The model is feasible and uses less computation time of a processor and less resources, e.g., number of etch rate measurement devices (ERMDs), etc., to maintain etch rates. For example, it is not necessary to use an ERMD to measure an etch rate to achieve etch rate uniformity in-chamber. As another example, it is not necessary to use multiple ERMDs in multiple plasma systems, e.g., chamber-to-chamber, etc., to achieve etch rate uniformity while processing a semiconductor substrate. Also, the in-chamber or chamber-to-chamber uniformity in etch rates provides a certainty in etch rates independent of a time at which the voltage and/or current is supplied by the RF generator in the plasma system to etch a wafer.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for chamber matching using a power control mode. It will be apparent that the present embodiments may be practiced without some or all of these specific details. In other instances, well known process operations have not been described in detail in order not to unnecessarily obscure the present embodiments.

Figure 1:
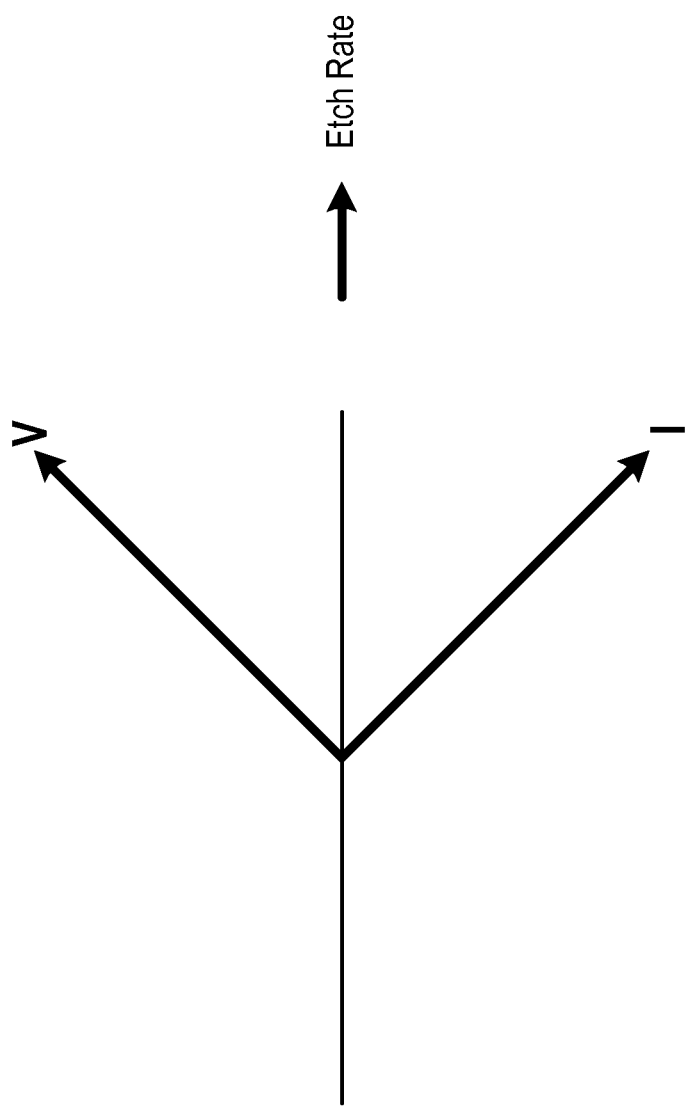
FIG. 1 is a diagram used to illustrate that a model etch rate is a function of voltage and current, in accordance with some embodiments described in the present disclosure.

FIG. 1 is a diagram used to illustrate that a model etch rate is a function of a voltage and/or current. In some embodiments, an etch rate is measured in terms of nanometers per minute. The voltage is measured at an output of a radio frequency (RF) generator and the current is measured at the output of the RF generator.

When one or more of the voltage and the current is changed, the model etch rate changes.

In some embodiments, the voltage is a voltage magnitude and the current is a current magnitude. Examples of a magnitude includes a zero-to-peak magnitude, a peak-to-peak magnitude, and a root mean square (RMS) magnitude.

Figure 2A:
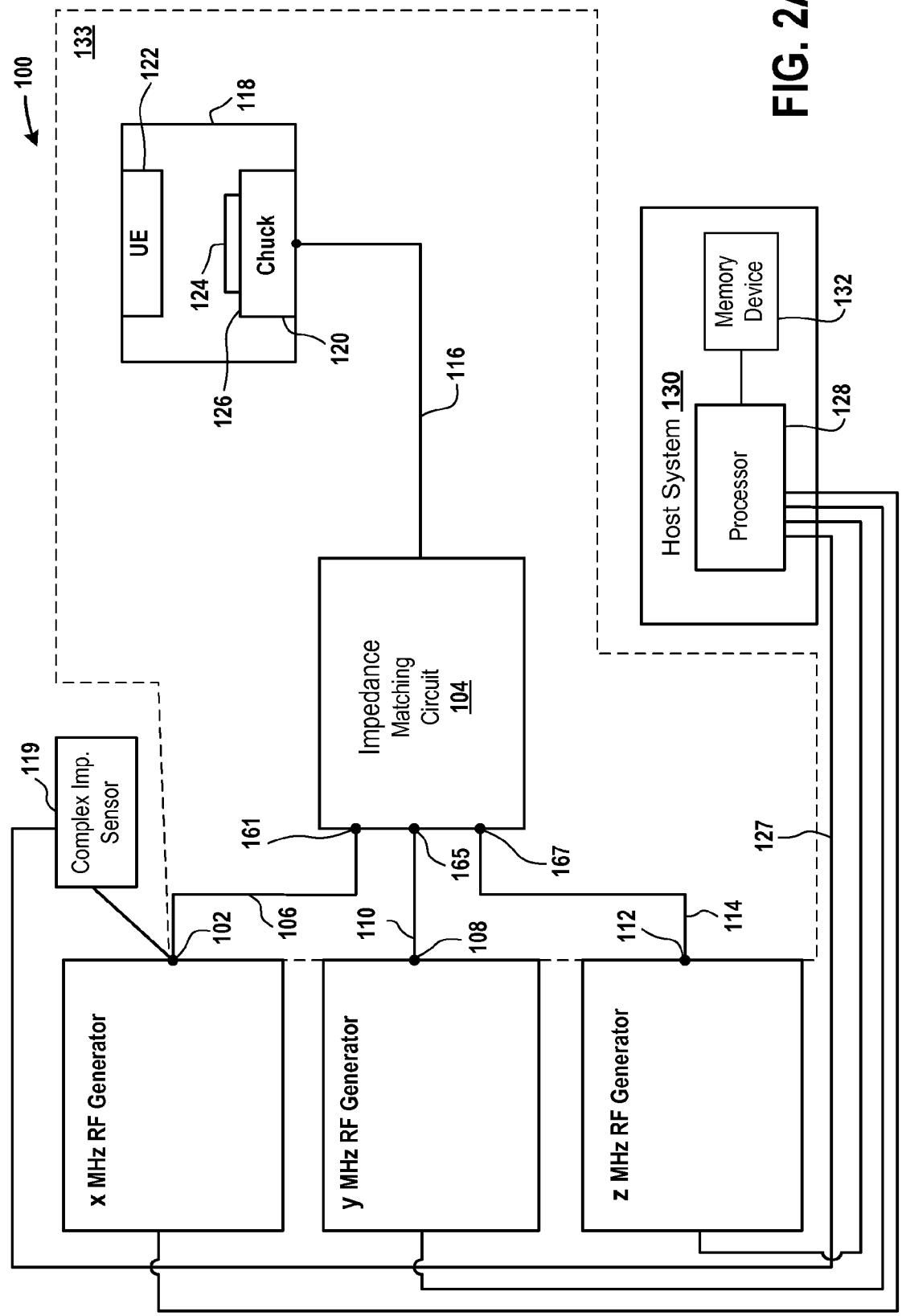
FIG. 2A is a diagram of an embodiment of a plasma system used to determine a model etch rate, in accordance with some embodiments described in the present disclosure.

FIG. 2A is a diagram of an embodiment of a plasma system 100 used to determine a model etch rate. The plasma system 100 includes an x megahertz (MHz) radio frequency (RF) generator, a y MHz RF generator, and a z MHz RF generator. Examples of x MHz include 2 MHz, 27 MHz, and 60 MHz. Examples of y MHz include 2 MHz, 27 MHz, and 60 MHz. Examples of z MHz include 2 MHz, 27 MHz, and 60 MHz.

In some embodiments, the x MHz is different than y MHz and z MHz, and y MHz is different than z MHz. For example, when x MHz is 2 MHz, y MHz is 27 MHz and z MHz is 60 MHz.

It should be noted that in some embodiments, a complex impedance sensor connected to an output of an RF generator is calibrated to a level of accuracy. For example, a complex impedance sensor 119 coupled to an output 102 of the x MHz RF generator measures the same amount of voltage, the same amount of current, and/or the same amount of phase every time the measurement is taken at the output 102. As another example, every time a measurement is taken at the output 102, the complex impedance sensor 119 measures an amount of voltage that is within a threshold of a measurement of the voltage at the output 102, and/or measures an amount of current at the output 102 that is within a threshold of a measurement of the current at the output 102, and/or measures a phase at the output 102 that is within a threshold of a measurement of the phase at the output 102. As yet another example, for a majority of times, a measurement is taken at the output 102, the complex impedance sensor 119 measures the same amount of voltage, the same amount of current, and/or the same amount of phase every time the measurement is taken at the output 102. As another example, for a majority of times, a measurement is taken at the output 102, the complex impedance sensor 119 measures an amount of voltage that is within a threshold of a measurement of the voltage at the output 102, and/or measures an amount of current at the output 102 that is within a threshold of a measurement of the current at the output 102, and/or measures a phase at the output 102 that is within a threshold of a measurement of the phase at the output 102.

In some embodiments, another complex impedance sensor (not shown) is coupled to the output 108 and yet another complex impedance sensor (not shown) is coupled to the output 112.

In several embodiments, the terms complex impedance sensor and complex voltage and current sensor are used interchangeably.

It should be noted in a variety of embodiments, a phase is a phase between a voltage and a current. For example, when a voltage is $V_m$ volts and current is $I_m$ amperes, a phase between the voltage and current is $\Phi$ degrees, where m is an integer greater than zero.

In various embodiments, a complex impedance sensor used to calibrate the x, y, and z MHz RF generators follows a pre-set standard, e.g., a National Institute of Standards and Technology (NIST) standard. For example, a calibrated complex impedance sensor connected to an output of an RF generator is NIST traceable.

In a number of embodiments, any number of RF generators, e.g., two, four, etc., are used within the plasma system 100.

An impedance matching circuit 104 is coupled to the output 102 via an RF cable 106. Similarly, the impedance matching circuit 104 is coupled to an output 108 of the y MHz RF generator via an RF cable 110 and the impedance matching circuit 104 is coupled to an output 112 of the z MHz RF generator via an RF cable 114. The impedance matching circuit 104 matches an impedance of a load coupled to the impedance matching circuit 104 at one side with an impedance of a source coupled to the impedance matching circuit 104 at another side. For example, the impedance matching circuit 104 matches an impedance of an RF transmission line 116 and a plasma chamber 118 with an impedance of the x MHz RF generator, the y MHz RF generator, the z MHz RF generator, the RF cable 106, the RF cable 110, and the RF cable 114.

The plasma chamber 118 is coupled to the impedance matching circuit 104 via the RF transmission line 116. The plasma chamber 118 includes a chuck 120, an upper electrode 122, and other parts (not shown), e.g., an upper dielectric ring surrounding the upper electrode 122, an upper electrode extension surrounding the upper dielectric ring, a lower dielectric ring surrounding a lower electrode of the chuck 120, a lower electrode extension surrounding the lower dielectric ring, an upper plasma exclusion zone (PEZ) ring, a lower PEZ ring, etc. The upper electrode 122 is located opposite to and facing the chuck 120. A dummy wafer 124 is supported on an upper surface 126 of the chuck 120. Each of the lower electrode and the upper electrode 122 is made of a metal, e.g., aluminum, alloy of aluminum, copper, etc. Examples of the chuck 120 include an electrostatic chuck (ESC) and a magnetic chuck.

In some embodiments, the dummy wafer 124 is used to determine an etch rate. For example, the dummy wafer 124 is made of a material other than a semiconductor. Examples of materials other than a semiconductor include glass, sodalime, borosilicate, quartz, ceramic, carbon fiber, etc. As another example, the dummy wafer 124 is cheaper than a semiconductor wafer.

In some embodiments, a semiconductor wafer is used instead of the dummy wafer 124. Various processes, e.g., chemical vapor deposition, cleaning, deposition, sputtering, etching, ion implantation, resist stripping, etc., are performed on the semiconductor wafer during production. Integrated circuits, e.g., application specific integrated circuit (ASIC), programmable logic device (PLD), etc. are developed on the semiconductor wafer and the integrated circuits are used in a variety of electronic items, e.g., cell phones, tablets, smart phones, computers, laptops, networking equipment, etc.

The RF cables 106, 110, 114, the impedance matching circuit 104, the RF transmission line 116, and the plasma chamber 118 are parts of a tool 133 of the plasma system 100.

In some embodiments, the upper electrode 122 includes one or more gas inlets, e.g., holes, etc., that are coupled to a central gas feed (not shown). The central gas feed receives one or more process gases from a gas reservoir (not shown). An example of a process gas includes an oxygen-containing gas, such as $O_2$. Other examples of the process gas include a fluorine-containing gas, e.g., tetrafluoromethane ($CF_4$), sulfur hexafluoride ($SF_6$), hexafluoroethane ($C_2F_6$), etc. The upper electrode 122 is grounded. The chuck 120 is coupled to the x MHz RF generator, the y MHz RF generator, and the z MHz RF generator via the impedance matching circuit 104.

When the process gas is supplied between the upper electrode 122 and the chuck 120 and when the x MHz RF generator and/or the y MHz RF generator and/or the z MHz RF generator supplies RF signals via the impedance matching circuit 104 and the RF transmission line 116 to the chuck 120, the process gas is ignited to generate plasma within the plasma chamber 118.

When the x MHz RF generator generates and provides an RF signal via the output 102, the RF cable 106, the impedance matching circuit 104, and the RF transmission line 116 to the chuck 120 on which the dummy wafer 124 is placed, the complex impedance sensor 119 measures a complex voltage and current at the output 102. In some embodiments, a complex voltage and current includes a voltage magnitude, a current magnitude, and a phase between the voltage magnitude and current magnitude. The complex voltage and current measured by the complex impedance sensor 119 is provided via a cable 127 to a processor 128 of a host system 130 for storage in a memory device 132 of the host system 130. The processor 128 is coupled to the complex impedance sensor 119 via the cable 127.

As used herein, a processor may be a central processing unit (CPU), a microprocessor, an application specific integrated circuit (ASIC), a programmable logic device (PLD), etc. Examples of a memory device include a read-only memory (ROM), a random access memory (RAM), or a combination thereof. A memory device may be a flash memory, a redundant array of storage disks (RAID), a hard disk, etc.

Similarly, the complex impedance sensors (not shown) coupled to the outputs 108 and 112 provides a measurement of a complex voltage and current via corresponding cables to the processor 128 for storage in the memory device 132.

The processor 128 calculates an etch rate associated with the plasma system 100 based on a measurement at a time $t_1$ of a complex voltage and current received from the complex impedance sensor 119. The measurement of the complex voltage and current is generated and received when the x MHz RF generator 162 supplies power via the output 102 to the plasma chamber 118. The processor 128 generates a model etch rate based on the measured complex voltage and current.

For example, the processor 128 calculates a sum of a number of terms to determine a model etch rate associated with the plasma system 100. Each term is a product of a coefficient and a function of the voltage measured at the time $t_1$, or a product of a coefficient and a function of the current measured at the time $t_1$, or a product of a coefficient, a function of the voltage measured at the time $t_1$, and a function of the current measured at the time $t_1$. As an example, the processor 128 calculates a model etch rate ER1001 as being equal to $C_{11}V_1+C_{12}I_1$, which is a polynomial of a first order, where each of $C_{11}V_1$ and $C_{12}I_1$ is a term, $C_{11}$ and $C_{12}$ are coefficients, $V_1$ is a voltage magnitude measured by the complex impedance sensor 119 at the time $t_1$, and $I_1$ is a current magnitude measured by the complex impedance sensor 119 at the time $t_1$. As another example, a model etch rate ER1002 is calculated as $C_{21}V_1+C_{22}I_1+C_{23}V_1^2+C_{24}V_1I_1+C_{25}I_1^2$, which is a polynomial of a second order, where each of $C_{21}V_1$, $C_{22}I_1$, $C_{23}V_1^2$, $C_{24}V_1I_1$, and $C_{25}I_1^2$ is a term, $C_{21}$, $C_{22}$, $C_{23}$, $C_{24}$, and $C_{25}$ are coefficients, where $I_1^2$ is a function, having a power of 2, of the current $I_1$, where $V_1^2$ is a function, having a power of 2, of the voltage $V_1$. As yet another example, a model etch rate ER1003 is calculated as $C_{31}V_1+C_{32}I_1+C_{33}V_1^2+C_{34}V_1I_1+C_{35}I_1^2+C_{36}V_1^3+C_{37}V_1^2I_1+C_{38}V_1I_1^2+C_{39}I_1^3$, which is a polynomial of a third order, where each of $C_{31}V_1$, $C_{32}I_1$, $C_{33}V_1^2$, $C_{34}V_1I_1$, $C_{35}I_1^2$, $C_{36}V_1^3$, $C_{37}V_1^2I_1$, $C_{38}V_1I_1^2$, and $C_{39}I_1^3$ is a term, $C_{31}$, $C_{32}$, $C_{33}$, $C_{34}$, $C_{35}$, $C_{36}$, $C_{37}$, $C_{38}$, and $C_{39}$ are coefficients, $I_1^3$ is a function, having a power of 3, of the current I, and $V_1^3$ is a function, having a power of 3, of the voltage $V_1$. As another example, a model etch rate ER1004 is calculated as $C_{41}V_1+C_{42}I_1+C_{43}V_1^2+C_{44}V_1I_1+C_{45}I_1^2+C_{46}V_1^3+C_{47}V_1^2I+C_{48}V_1I_1^2+C_{49}I_1^3+C_{50}V_1^4+C_{51}V_1^3I_1+C_{52}V_1^2I_1^2+C_{53}V_1I_1^3+C_{54}I_1^4$, which is a polynomial of a fourth order, where each of $C_{41}V_1$, $C_{42}I_1$, $C_{43}V_1^2$, $C_{44}V_1I_1$, $C_{45}I_1^2$, $C_{46}V_1^3$, $C_{47}V_1^2I$, $C_{48}V_1I_1^2$, $C_{49}I_1^3$, $C_{50}V_1^4$, $C_{51}V_1^3I_1$, $C_{52}V_1^2I_1^2$, $C_{53}V_1I_1^3$, and $C_{54}I_1^4$ is a term, $C_{41}$, $C_{42}$, $C_{43}$, $C_{44}$, $C_{45}$, $C_{46}$, $C_{47}$, $C_{48}$, $C_{49}$, $C_{50}$, $C_{51}$, $C_{52}$, $C_{53}$, and $C_{54}$ are coefficients, $I_1^4$ is a function, having a power of 4, of the current $I_1$, and $V_1^4$ is a function, having a power of 4, of the voltage $V_1$.

It should be noted that $V_m$ is a voltage magnitude, e.g., a zero-to-peak voltage, a peak-to-peak voltage, a root mean square (RMS) voltage, etc., and $I_m$ is a current magnitude, e.g., a zero-to-peak current, a peak-to-peak current, an RMS current, etc., where "m" is an integer greater than zero. It should be noted that in some embodiments, each of the first order polynomial, the second order polynomial, the third order polynomial, and the fourth order polynomial is a portion of a Taylor series expansion. As an example, the processor 128 calculates an etch rate model ER100$n$ as being equal to a Taylor series expansion, which is also an $n^{th}$ order polynomial, of a function of the voltage $V_1$, a function of the current $I_1$, and a coefficient, where n is an integer. To illustrate, the processor 128 calculates the etch rate ER100$n$ as the $n^{th}$ order polynomial that converges to a value, where n is an integer greater than zero.

In various embodiments, a number of terms in an etch rate model ranges from one to a large number, e.g., 100, 1000, 10000, etc. For example, the etch rate ER1001 includes two terms, the etch rate ER1002 includes five terms, the etch rate ER1003 includes nine terms, and the etch rate ER1004 includes 14 terms.

In a number of embodiments, a number of terms used to determine an etch rate model associated with a plasma system is provided as an input by a user via an input device (not shown), e.g., a mouse, a keyboard, a stylus, a touchscreen, etc., that is coupled to the processor 128. In various embodiments, the processor 128 determines a number of terms used to determine an etch rate model associated with a plasma system to achieve convergence in a value of the etch rate model. For example, the processor 128 continues to add terms used in determining an etch rate model associated with a plasma system until a convergence in the etch rate model is achieved.

In various embodiments, the processor 128 receives coefficients, e.g., the coefficients $C_{11}$, $C_{12}$, $C_{21}$, $C_{22}$, $C_{23}$, $C_{24}$, $C_{25}$, $C_{31}$, $C_{32}$, $C_{33}$, $C_{34}$, $C_{35}$, $C_{36}$, $C_{37}$, $C_{38}$, $C_{39}$, $C_{41}$, $C_{42}$, $C_{43}$, $C_{44}$, $C_{45}$, $C_{46}$, $C_{47}$, $C_{48}$, $C_{49}$, $C_{50}$, $C_{51}$, $C_{52}$, $C_{53}$, $C_{54}$, etc., from another processor that determines the coefficients in the same manner in which the processor 128 determines the coefficients. A manner of determining the coefficients is described below.

In some embodiments, the tool 133 provides a higher yield among several tools of several plasma systems. The several tools are of the same or similar type as the tool 133. For example, characteristics, e.g., a resistance, capacitance, inductance, or a combination thereof, etc., of the various corresponding tools is the same as or within a range of a characteristic of the tool 133. As another example, the several tools have the same structure as that of and/or perform the same function as that performed by the tool 133.

In various embodiments, the tool 133 has a higher yield than a tool of another plasma system that is of the same or similar type when the higher yielding tool is used to etch a wafer to achieve a higher aspect ratio than that achieved using the lower yielding tool, or when use of the higher yielding tool results in wafers that are cleaner than those cleaned using the lower yielding tool, or when the higher yielding tool etches at a faster rate than that achieved using the lower yielding tool, or when the higher yielding tool cleans wafers at a faster rate than that achieved using the lower yielding tool, or when the higher yielding tool has a higher rate of processing wafers than that of the lower yielding tool, or a combination thereof.

In various embodiments, the tool 133 is referred to as a golden tool.

In some embodiments, an etch rate associated with the plasma system 100 is maintained constant over time. For example, when there is a variation in the voltage $V_1$ and/or a variation in the current $I_1$ at a time $t_2$, the x MHz RF generator adjusts power, e.g., a combination of $V_1$ and $I_1$, etc., delivered via the output 102 of the x MHz RF generator to maintain the etch rate associated with the plasma system 100. The time $t_2$ is after the time $t_1$. The variation in the voltage $V_1$ and/or the variation in the current $I_1$ are received by the processor 128 from the complex impedance sensor 119. As another example, when there is a variation in the voltage $V_1$ and/or a variation in the current $I_1$ at the time $t_2$, the x MHz RF generator adjusts the voltage $V_1$ and/or the current $I_1$ measured at the output 102 of the x MHz RF generator to maintain the etch rate associated with the plasma system 100. As another example, after determining the etch rate ER1001, when there is a change in power of an RF signal supplied by the x MHz RF generator, the x MHz RF generator adjusts the power to achieve the etch rate ER1001. As another example, when there is a fluctuation in power delivered by the x MHz RF generator to the plasma chamber 118, the x MHz RF generator adjusts the power to achieve the etch rate ER1001.

In various embodiments, after determining the etch rate associated with the plasma system 100 using the dummy wafer 124, the dummy wafer 124 is replaced with a semiconductor wafer for etching the semiconductor wafer. One or more of the x, y, and z MHz RF generators supply RF power via the corresponding outputs 102, 108, and 112, via the corresponding RF cables 106, 108, and 114, via the impedance matching circuit 104, via the RF transmission line 116 to the chuck 120 when a semiconductor wafer is placed on the top surface 126 of the chuck 120. When the RF power is supplied by the x MHz RF generator, the complex impedance sensor 119 measures a complex voltage and current at the output 102 at the time $t_2$.

In some embodiments, the processor 128 of the host system 130 maintains a recipe over time for generating plasma within the plasma chamber 118 during times the etch rate associated with the plasma system 100 is determined and the constant etch rate is maintained. For example, the processor 128 maintains as constant a pressure within the plasma chamber 118, and/or a temperature within the plasma chamber 118, and/or a frequency of the x MHz RF generator, and/or a frequency of the y MHz RF generator, and/or a frequency of the z MHz RF generator, and/or a gap between the upper electrode 122 and the chuck 120, and/or a chemistry of one or more process gases within the plasma chamber 118. As another example, the processor 128 maintains as constant a pressure within the plasma chamber 118 and/or a temperature within the plasma chamber 118 and/or a gap between the upper electrode 122 and the chuck 120 and/or a chemistry of one or more process gases within the plasma chamber 118. As another example, the processor 128 maintains similar pressures within the plasma chamber 118 and/or similar temperatures within the plasma chamber 118 and/or similar frequencies of the x MHz RF generator and/or similar frequencies of the y MHz RF generator and/or similar frequencies of the z MHz RF generator and/or similar gaps between the upper electrode 122 and the chuck 120 and/or similar chemistries of one or more process gases within the plasma chamber 118. As another example, the processor 128 maintains similar pressures within the plasma chamber 118 and/or similar temperatures within the plasma chamber 118 and/or similar gaps between the upper electrode 122 and the chuck 120 and/or similar chemistries of one or more process gases within the plasma chamber 118.

In some embodiments, similar pressures are maintained within the plasma chamber 118 when a first one of the pressures is within a range of a second one of the pressures. In various embodiments, similar temperatures are maintained within the plasma chamber 118 when a first one of the temperatures is within a range of a second one of the temperatures. In various embodiments, similar frequencies of an RF generator are maintained when a first one of the frequencies is within a range of a second one of the frequencies. In some embodiments, similar gaps are maintained within the plasma chamber 118 when a first one of the gaps is within a range of a second one of the gaps. In a variety of embodiments, similar chemistries are maintained within the plasma chamber 118 when an amount of each process gas is maintained within a pre-determined range and/or a combination of types of process gases is maintained within the plasma chamber 118. In some embodiments, similar chemistries are maintained within the plasma chamber 118 when a combination of types of process gases is maintained within the plasma chamber 118. Examples of types of a process gas include an oxygen containing gas, fluorine containing gas, etc. To illustrate a fluorine containing gas is of a different type than an oxygen containing gas. In some embodiments, a first process gas is of a different type than a second process gas when the first process gas includes a chemical element that is not included within the second process gas.

In various embodiments, the processor 128 controls a gas supply valve (not shown) that facilitates supply of a gas from a gas reservoir (not shown) to gas inlets of an upper electrode of a plasma chamber to control pressure within the plasma chamber. For example, the processor 128 controls a driver (not shown), e.g., a transistor, etc., that supplies a current to open or close the valve by an amount to control an amount of the process gas supplied to a plasma chamber. The control of the supply of the process gas also allows the processor 128 to control the pressure within a plasma chamber in which the gas is supplied.

In several embodiments, the processor 128 controls a number of gas supply valves (not shown) that facilitate supply of a number of process gases from a number of gas reservoirs (not shown) to gas inlets of an upper electrode of a plasma chamber to control chemistry within the plasma chamber. For example, the processor 128 controls a driver that supplies a current to open or close a valve by an amount to control an amount of the first process gas that is supplied from a first gas reservoir to gas inlets of the upper electrode 122 and controls another driver that supplies a current to open or close another valve by an amount to control an amount of the second process gas that is supplied from a second gas reservoir to the gas inlets. In various embodiments, the second process gas is different from the first process gas. For example, the first process gas is an oxygen-based process gas and the second process gas is a fluorine-based process gas. As another example, the first process gas is tetrafluoromethane and the second process gas is sulfur hexafluoride. As yet another example, the first process gas is of a different type than a type of the second process gas.

In some embodiments, a heater is included within a chuck of a plasma chamber and the heater is controlled by the processor 128 via a driver to change temperature within the plasma chamber.

In several embodiments, a heat transfer mechanism, e.g., a duct, etc., is provided within a plasma chamber and a flow of a cooling liquid within the heat transfer mechanism is controlled by the processor 128 via a valve and a driver to change temperature within the plasma chamber.

In various embodiments, an upper electrode of a plasma chamber is located within an upper structure (not shown) that is may be raised up or down using a motor-driven screw mechanism (not shown). The processor 128 controls the motor-driven screw mechanism via a driver to move the upper structure up or down to change the gap between the upper electrode and a chuck facing the upper electrode.

In some embodiments, the processor 128 sends a signal to a digital signal processor (DSP) of an RF generator via a cable to adjust a voltage and/or a current to achieve an etch rate. For example, the processor 128 sends a voltage magnitude of an RF signal to an RF generator. Upon receiving the signal, a digital signal processor (DSP) of the RF generator sends the voltage magnitude to a drive and amplifier system (DAS) of the RF generator. For example, a DSP of the RF generator receives the voltage magnitude and sends the voltage magnitude to a DAS of the RF generator. The DAS of the RF generator generates an RF signal having the voltage magnitude and to achieve the etch rate. The RF signal is supplied via an RF cable and the impedance matching circuit 104 and the RF transmission line 116 to the plasma chamber 118.

It should be noted that in some embodiments, any number of RF generators are used in the plasma system 100.

Figure 2B:
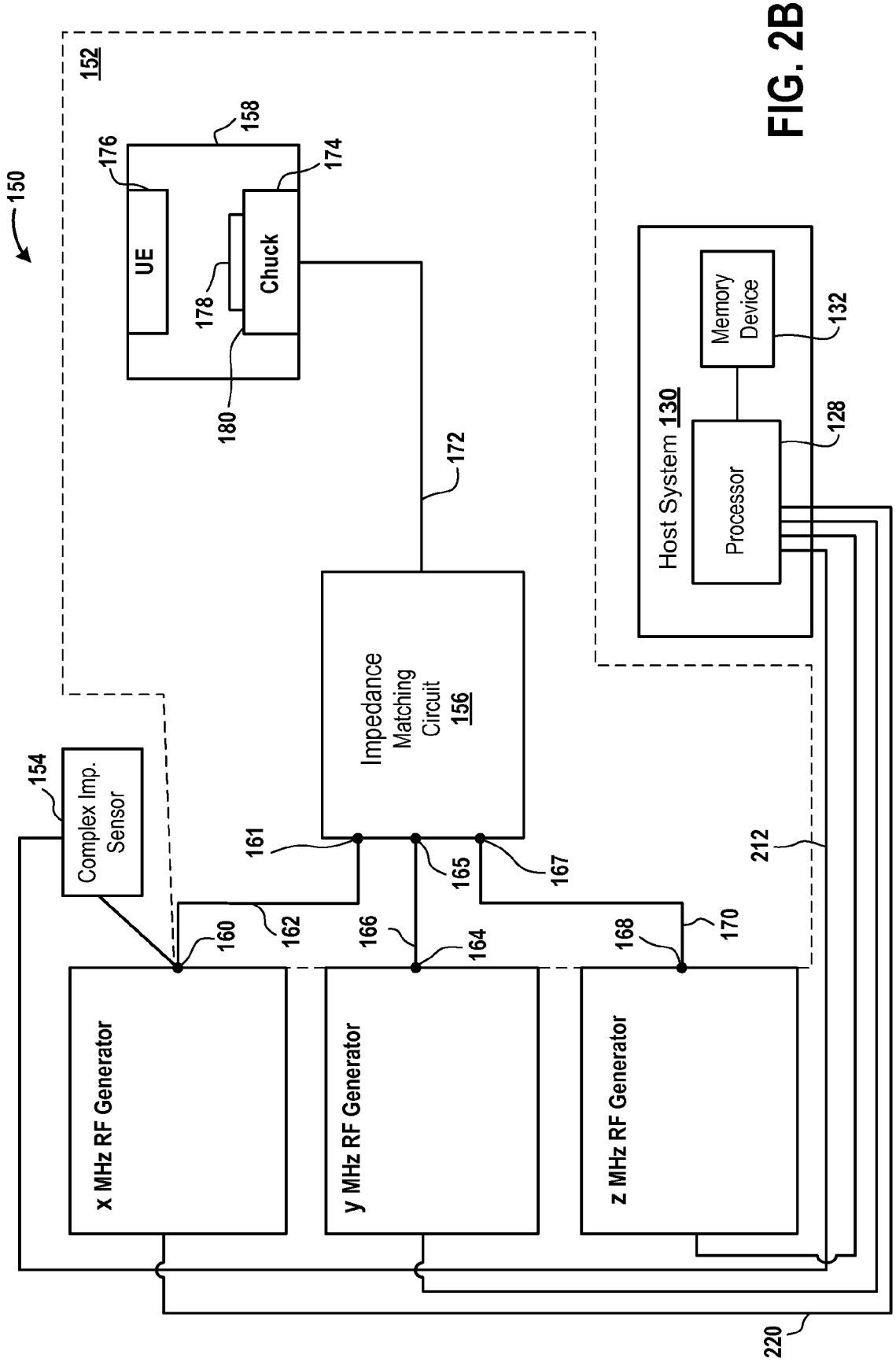
FIG. 2B is a diagram of an embodiment of a plasma system that includes a tool of the same or similar type as that of a tool of the plasma system of FIG. 2A, in accordance with various embodiments described in the present disclosure.

FIG. 2B is a diagram of an embodiment of a plasma system 150 that includes a tool 152 of the same or similar type as that of the tool 133 (FIG. 2A). An etch rate determined using the plasma system 100 (FIG. 2A), e.g., an etch rate determined using voltage and/or current measured at the time $t_1$, is applied to the plasma system 150 to perform chamber-to-chamber matching of etch rates.

The plasma system 150 includes the x, y, and z MHz RF generators, a complex impedance sensor 154, an impedance matching circuit 156, and a plasma chamber 158. An input 161 of impedance matching circuit 156 is coupled to the output 160 of the x MHz RF generator via an RF cable 162, an input 165 of the impedance matching circuit 156 is coupled to an output 164 of the y MHz RF generator via an RF cable 166, and an input 167 of the impedance matching circuit 156 is coupled to an output 168 of the z MHz RF generator via an RF cable 170. The plasma chamber 158 is coupled to the impedance matching circuit 156 via an RF transmission line 172.

The plasma chamber 158 includes a chuck 174, an upper electrode 176, and other parts, which are described above. The upper electrode 176 is located opposite to and facing the chuck 174 and is grounded. A work piece 178, e.g., a semiconductor wafer, etc., is supported on an upper surface 180 of the chuck 174. Various processes, which are described above, are performed on the work piece 178 during production. Integrated circuits are developed on the work piece 175 and the integrated circuits are used in a variety of electronic items, e.g., cell phones, tablets, smart phones, computers, laptops, networking equipment, etc. Each of the lower electrode of the plasma chamber 158 and the upper electrode 176 is made of a metal, e.g., aluminum, alloy of aluminum, copper, etc. The chuck 174 may be an ESC or a magnetic chuck.

In various embodiments, the plasma chamber 158 has the same structure as that of the plasma chamber 118 (FIG. 2A). For example, the plasma chamber 158 includes structural elements that have same dimensions as that of corresponding structural elements in the plasma chamber 118. As another example of the plasma chambers 118 and 158 having the same structure, the plasma chamber 158 includes structural elements that are of the same type as that of corresponding structural elements in the plasma chamber 118. To illustrate, a transformer coupled plasma (TCP) chamber has one or more structural elements of a different type than one or more structural elements of an inductively coupled plasma (ICP) chamber and both the TCP and the ICP chambers have one or more structural elements of different types than one or more elements of an electron cyclotron resonance (ECR) plasma chamber. As another illustration, a plasma chamber that includes inductors as electrodes is of a different type than a plasma chamber that includes capacitors as electrodes.

Examples of structural elements of a plasma chamber include an upper electrode, a lower electrode, an upper plasma exclusion zone (PEZ) ring, a lower PEZ ring, a confinement ring assembly, an edge ring, an insulator layer, gas distribution apertures, walls of the plasma chamber, an upper dielectric ring surrounding the upper electrode, an upper electrode extension surrounding the upper dielectric ring, a lower dielectric ring surrounding the lower electrode, a heating element located within the upper electrode or the lower electrode, a cooling element located within the upper electrode or the lower electrode, a lower electrode extension surrounding the lower dielectric ring, etc. In various embodiments, the lower electrode and the lower electrode extension are made of a metal, e.g., anodized aluminum, alloy of aluminum, etc. Also, in some embodiments, the upper electrode and the upper electrode extension are made of a metal, e.g., aluminum, alloy of aluminum, etc. In several embodiments, the upper electrode is located opposite to and facing the lower electrode and the upper electrode extension is located opposite to and facing the upper electrode.

Examples of dimensions of a structural element include a size of the element, a length of the element, a depth of the element, a width of the elements, a surface area of the element, a volume occupied by the element, etc.

Examples of structural elements of different types include a plate electrode, an electric coil electrode, etc.

In various embodiments, the plasma chamber 158 is structurally identical to plasma chamber 118 and has a different identification code than that of the plasma chamber 118. For example, an entity identifies the plasma chamber 158 using an identity code aaaa and the entity identifies the plasma chamber 118 using an identity code bbbb.

In a number of embodiments, the plasma chamber 158 is structurally identical to the plasma chamber 118 and is used to perform the same function as that of the plasma chamber 118. As an example of the same function, the plasma chamber 158 has similar characteristics, e.g., capacitance, resistance, inductance, a combination thereof, etc., as that of the plasma chamber 118. To illustrate, the plasma chamber 158 has an inductance within a range of inductance of the plasma chamber 118. As another illustration, the plasma chamber 158 has a capacitance that is within a range of capacitance of the plasma chamber 118. As yet another illustration, the plasma chamber 158 has a resistance within a range of a resistance of the plasma chamber 118. As another illustration, the plasma chamber 158 has a combination of inductance, resistance, and capacitance that is within a range of combination of inductance, resistance, and capacitance of the plasma chamber 118. Examples of a function performed by a plasma chamber include physical vapor deposition (PVD), chemical vapor deposition (CVD), plasma-enhanced CVD (PECVD), metal CVD, a high-density plasma CVD (HDP-CVD) function, a photoresist strip function, a photoresist surface preparation, ultraviolet thermal processing (UVTP), etc.

In various embodiments, the plasma chamber 158 is structurally and functionally identical to plasma chamber 118 and has a different identification code than that of the plasma chamber 118.

Moreover, in various embodiments, the RF transmission line 172 is structurally and/or functionally identical to the RF transmission line 116 (FIG. 2A). An RF transmission line is described further in FIG. 3.

In some embodiments, the RF cable 162 is coupled to the output 102, the RF cable 166 is coupled to the output 108, and the RF cable 170 is coupled to the output 112.

Figure 3:
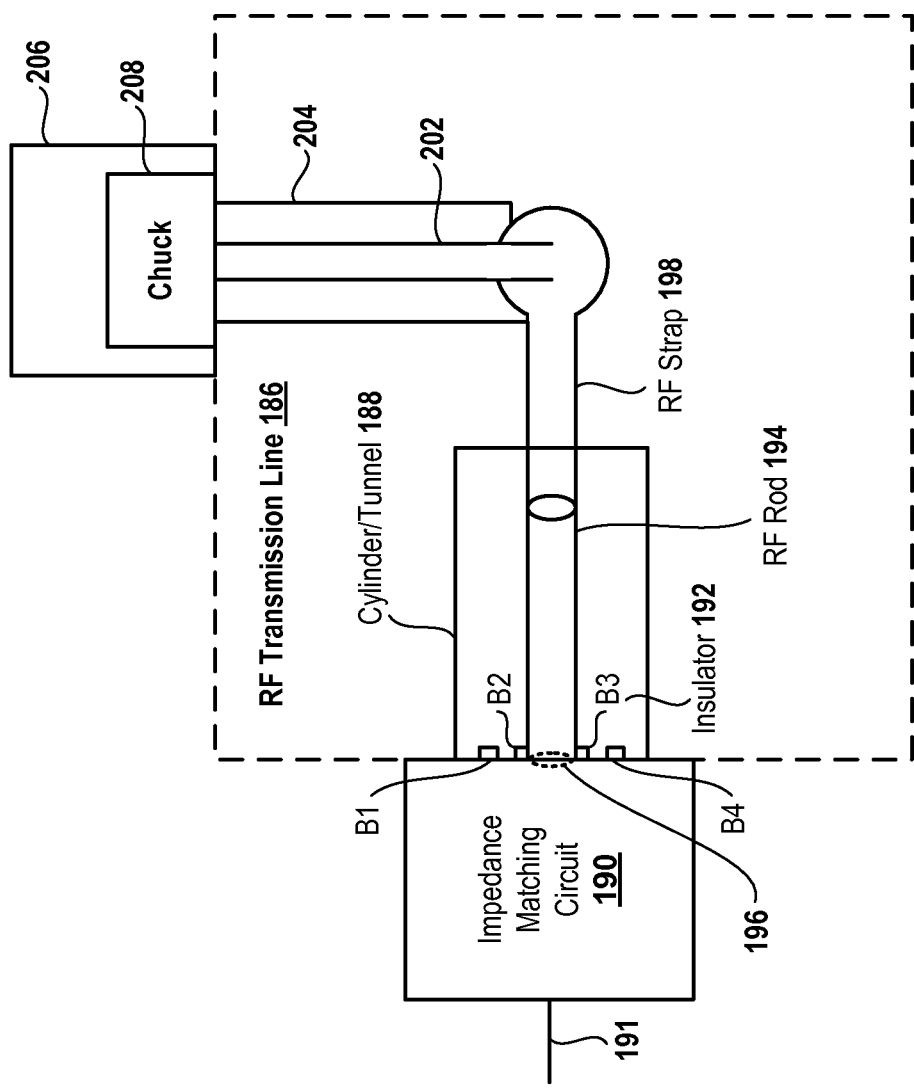
FIG. 3 is a diagram of an embodiment of a structure of a radio frequency (RF) transmission line, in accordance with several embodiments described in the present disclosure.

FIG. 3 is a diagram of an embodiment of a structure of an RF transmission line 186, which is an example of the RF transmission line 116 (FIG. 2A) or the RF transmission line 172 (FIG. 2B). The RF transmission line 186 includes a cylinder 188, e.g., a tunnel, etc., that is bolted to an impedance matching circuit 190, which is an example of the impedance matching circuit 104 (FIG. 2A) or the impedance matching circuit 156 (FIG. 2B). The impedance matching circuit 190 is coupled with an RF cable 191, which is an example of the RF cable 106 (FIG. 2A) or the RF cable 162 (FIG. 2B). Within a hollow of the cylinder 188 lies an insulator 192 and an RF rod 194.

The RF transmission line 186 is bolted via bolts B1, B2, B3, and B4 to the impedance matching circuit 190. In one embodiment, the RF transmission line 186 is bolted via any number of bolts with the impedance matching circuit 190. In some embodiments, instead of or in addition to bolts, any other form of attachment, e.g., glue, screws, etc., is used to attach the RF transmission line 186 to the impedance matching circuit 190.

The RF transmission rod 194 is coupled with an output 196 of the impedance matching circuit 190. Also, an RF strap 198, also known as RF spoon, is coupled with the RF transmission rod 194 and with an RF rod 202, a portion of which is located within a support 204, e.g., a cylinder. In an embodiment, a combination of the cylinder 188, the RF strap 198, the support 204 and the RF rod 202 forms the RF transmission line 186. The support 204 provides support to a plasma chamber 206, which is an example of the plasma chamber 118 (FIG. 2A) or the plasma chamber 158 (FIG. 2B). The support 204 is attached to a chuck 208 of the plasma chamber 206. The chuck 208 is an example of the chuck 120 (FIG. 2A) or the chuck 174 (FIG. 2B). An RF signal is supplied from the x MHz generator (FIG. 2A or 2B) via the RF cable 191, the impedance matching circuit 190, the RF rod 194, the RF strap 198, and the RF rod 202 to the chuck 208.

Referring back to FIG. 2B, in some embodiments, the RF transmission line 172 is structurally identical to the RF transmission line 116 (FIG. 2A). For example, the RF transmission line 172 includes identical elements as that of the RF transmission line 116. Examples of elements of an RF transmission line include an RF rod that is coupled to an impedance matching circuit, a cylinder that surrounds the RF rod, an RF spoon, an RF rod that is coupled to the RF spoon and to a chuck, and a cylinder that surrounds at least a portion of the RF rod.

In various embodiments, the RF transmission line 172 is structurally identical to the RF transmission line 116 and has different identification code than that of the RF transmission line 116.

In a number of embodiments, the RF transmission line 172 is functionally identical to the RF transmission line 116. For example, the RF transmission line 172 has similar characteristics to that of the RF transmission line 116. To illustrate, the RF transmission line 172 has an inductance within a range of inductance of the RF transmission line 116. As another illustration, RF transmission line 172 has a capacitance that is within a range of capacitance of the RF transmission line 116. As yet another illustration, the RF transmission line 172 has a resistance within a range of a resistance of the RF transmission line 116. As another illustration, RF transmission line 172 has a combination of inductance, resistance, and capacitance that is within a range of combination of inductance, resistance, and capacitance of the RF transmission line 116.

In some embodiments, the RF transmission line 172 is functionally identical to the RF transmission line 116 and has different identification code than that of the RF transmission line 116.

In some embodiments, the RF transmission line 172 is structurally and functionally identical to the RF transmission line 116 and has different identification code than that of the RF transmission line 116.

Similarly, in some embodiments, the impedance matching circuit 156 has the same structure as that of the impedance matching circuit 104 (FIG. 2A). For example, the impedance matching circuit 156 has the same number of capacitors as that of the impedance matching circuit 104, and/or the same number of inductors as that of the impedance matching circuit 104. Also, in this example, the capacitors in both the impedance matching circuits 104 and 156 are connected with each other in the same manner, e.g., serial, parallel, etc. Moreover, in this example, the inductors in both the impedance matching circuits 104 and 156 are connected with each other in the same manner, e.g., serial, parallel, etc.

In various embodiments, the impedance matching circuit 156 is structurally identical to the impedance matching circuit 104 and has a different identification code than that of the impedance matching circuit 104.

In several embodiments, the impedance matching circuit 156 performs the same function as that performed by the impedance matching circuit 104. For example, the impedance matching circuit 156 has similar characteristics to that of the impedance matching circuit 104. To illustrate, the impedance matching circuit 156 has an inductance within a range of inductance of the impedance matching circuit 104. As another illustration, the impedance matching circuit 156 has a capacitance that is within a range of capacitance of the impedance matching circuit 104. As another illustration, impedance matching circuit 156 has a combination of inductance and capacitance that is within a range of combination of inductance and capacitance of the impedance matching circuit 104.

In various embodiments, the impedance matching circuit 156 performs the same function as that performed by the impedance matching circuit 104 and has different identification code than that of the impedance matching circuit 104.

In various embodiments, the impedance matching circuit 156 has the same structure and performs the same function as that performed by the impedance matching circuit 104, and has different identification code than that of the impedance matching circuit 104.

The RF cable 162 is structurally the same as that of the RF cable 106 (FIG. 2A). For example, each RF cable 162 and RF cable 106 includes a conductor, which is surrounded by an insulator. As another example, the RF cable 162 has the same dimensions, e.g., length, diameter, etc., as that of the RF cable 106.

In some embodiments, the RF cable 162 has the same structure as that of the RF cable 106 and has a different identification code than that of the RF cable 106.

In various embodiments, the RF cable 162 performs the same function as that of the RF cable 106. For example, the RF cable 162 has similar characteristics to that of the RF cable 106. To illustrate, the RF cable 162 has a resistance within a range of a resistance of the RF cable 106 and/or has a capacitance within a range of a capacitance of the RF cable 106 and/or has an inductance within a range of an inductance of the RF cable 106.

In several embodiments, the RF cable 162 performs the same function as that performed by the RF cable 106 and has a different identification code than that of the RF cable 106.

In a number of embodiments, the RF cable 162 has the same structure and performs the same function as that of the RF cable 106, and has a different identification code than that of the RF cable 106.

Similarly, the RF cable 166 has the same structure as that of the RF cable 110 (FIG. 2A) and/or performs the same function as that of the RF cable 110 and/or has a different identification code than that of the RF cable 110. Moreover, the RF cable 170 has the same structure as that of the RF cable 114 (FIG. 2A) and/or performs the same function as that of the RF cable 114 and/or has a different identification code than that of the RF cable 114.

The RF cables 162, 164, 170, the impedance matching circuit 156, the RF transmission line 172, and the plasma chamber 158 are parts of the tool 152 of the plasma system 150.

In various embodiments, the tool 133 (FIG. 2A), which is a golden tool, provides a higher yield than that provided by the tool 152.

The x MHz RF generator generates and supplies RF power via the output 160, the RF cable 162, the impedance matching circuit 156, and the RF transmission line 172 to the chuck 174 on which the wafer 178 is placed for etching. Moreover, the y MHz RF generator generates and supplies RF power via the output 164, the RF cable 166, the impedance matching circuit 156, and the RF transmission line 172 to the chuck 174. Also, the z MHz RF generator generates and supplies RF power via the output 168, the RF cable 170, the impedance matching circuit 156, and the RF transmission line 172 to the chuck 174. When a process gas is supplied from a gas supply via a gas feed and gas inlets of the upper electrode 176 to a space between the upper electrode 176 and the chuck 174 and the chuck 174 receives RF power from RF signals supplied by the x, y, and/or z MHz RF generators, the process gas is ignited to generate plasma within the plasma chamber 158.

The complex impedance sensor 154 measures a voltage magnitude, a current magnitude, and a phase between the voltage magnitude and the current magnitude when RF signal is supplied by the x MHz RF generator via the output 160. Similarly, another complex impedance sensor (not shown) coupled to the output 164 measures a voltage magnitude, a current magnitude, and a phase between the voltage magnitude and the current magnitude when RF signal is supplied by the y MHz RF generator via the output 164. Also, a complex impedance sensor (not shown) coupled to the output 168 measures voltage, current, and phase between the voltage and current when RF signal is supplied by the z MHz RF generator via the output 168.

The processor 128 that is coupled to the complex impedance sensor 154 via a cable 212 receives via the cable 212 the complex voltage and current measured by the complex impedance sensor 154, receives the complex voltage and current measured by the complex impedance sensor coupled to the output 164, and receives the complex voltage and current measured by the complex impedance sensor coupled to the output 168.

The processor 128 determines an etch rate associated with the plasma system 150 based on the complex voltage and current received from the complex impedance sensor 154. For example, the processor 128 determines an etch rate associated with the plasma system 150 in a manner similar to that of determining an etch rate associated with the plasma system 100. As another example, the processor 128 determines an etch rate ER1501 as being equal to $C_{11}V_2+C_{12}I_2$, where $V_2$ is a voltage magnitude measured by the complex impedance sensor 154 and $I_2$ is a current magnitude measured by the complex impedance sensor 154. As another example, an etch rate ER1502 is calculated as $C_{21}V_2+C_{22}I_2+C_{23}V_2^2+C_{24}V_2I_2+C_{25}I_2^2$. As yet another example, an etch rate ER1503 is calculated as $C_{31}V_2+C_{32}I_2+C_{33}V_2^2+C_{34}V_2I_2+C_{35}I_2^2+C_{36}V_2^3+C_{37}V_2^2I_2+C_{38}V_2I_2^2+C_{39}I_2^3$. As another example, an etch rate ER1504 is calculated as $C_{41}V_2+C_{42}I_2+C_{43}V_2^2+C_{44}V_2I_2+C_{45}I_2^2+C_{46}V_2^3+C_{47}V_2^2I_2+C_{48}V_2I_2^2+C_{49}I_2^3+C_{50}V_2^4+C_{51}V_2^3I_2+C_{52}V_2^2I_2^2+C^{53}V_2I_2^3+C_{54}I_2^4$. As another example, the processor 128 calculates an etch rate ER150$n$ as being equal to a Taylor series expansion, which is also an $n^{th}$ order polynomial, where n is an integer. To illustrate, the processor 128 calculates the etch rate 150$n$ as the $n^{th}$ order polynomial that converges to a value.

The processor 128 compares the etch rate determined using the tool 133 (FIG. 2A) with the etch rate determined using the tool 152 to determine whether the etch rate determined using the tool 133 is the same as or within a limit of the etch rate determined using the tool 152. For example, the processor 128 determines whether the etch rate ER1001 matches or is within a limit of the etch rate ER1501. As another example, the processor 128 determines whether the etch rate ER1002 matches or is within a limit of the etch rate ER1502. As yet another example, the processor 128 determines whether the etch rate ER1003 matches or is within a limit of the etch rate ER1503. As another example, the processor 128 determines whether the etch rate ER1004 matches or is within a limit of the etch rate ER1504. As another example, the processor 128 determines whether the etch rate ER100$n$ matches or is within a limit of the etch rate ER150$n$.

Upon determining that it is not the case that the etch rate determined using the tool 133 is the same as or within a limit of the etch rate determined using the tool 152, the processor 128 sends a signal to the x MHz RF generator to adjust the voltage $V_2$ and/or the current $I_2$. It should be noted that in some embodiments, adjustment of both $V_2$ and $I_2$ is an adjustment of power. In various embodiments, power is a product of $V_2$ and $I_2$. The processor 128 sends the signal to the x MHz RF generator to adjust the voltage $V_2$ and/or the current $I_2$ to facilitate achieving the etch rate determined using the tool 133. For example, when the etch rate ER1501 does not match or is not within the limit of the etch rate ER1001, the processor 128 sends a signal to the x MHz RF generator to change the voltage $V_2$ and/or the current $I_2$ to facilitate matching the etch rate ER1001 with the etch rate 1501. As another example, when the etch rate ER150$n$ is not within a limit of the etch rate ER100$n$, the processor 128 sends a signal to the x MHz RF generator to change the voltage $V_2$ and/or the current $I_2$ to facilitate matching the etch rate ER100$n$ with the etch rate 150$n$.

Upon receiving a signal from the processor 128 via a line 220, the x MHz RF generator adjusts, e.g., increases, decreases, etc., the voltage $V_2$ and/or current $I_2$ that is generated by the x MHz RF generator to achieve the etch rate that is determined using the tool 133. For example, to achieve the etch rate 100$n$, the x MHz RF generator adjusts a magnitude of power that is delivered or supplied via the output 160, the RF cable 162, the impedance matching circuit 156, and the RF transmission line 172 to the plasma chamber 158 in which the wafer 178 is placed. As another example, to achieve the etch rate 100$n$, the x MHz RF generator adjusts a magnitude of voltage of an RF signal and/or a magnitude of a current of the RF signal that is supplied via the output 160, the RF cable 162, the impedance matching circuit 156, and the RF transmission line 172 to the plasma chamber 158.

When an etch rate determined using the tool 152 matches or is within a limit of an etch rate determined using the tool 133, chamber-to-chamber matching of etch rate is achieved.

In some embodiments, the processor 128 of the host system 130 maintains a recipe over time for generating plasma within the plasma chambers 118 and 158 during a time the constant etch rate is maintained within the plasma chambers 118 and 158. For example, the processor 128 maintains the same or similar pressure within the plasma chambers 118 and 158, and/or maintains the same or similar temperature within the plasma chambers 118 and 158, and/or maintains the same or similar frequency of the x MHz RF generators within the plasma chambers 118 and 158, and/or maintains the same or similar frequency of the y MHz RF generators within the plasma chambers 118 and 158, and/or maintains the same or similar frequency of the z MHz RF generators within the plasma chambers 118 and 158, and/or maintains same or similar chemistries of one or more process gases within the plasma chambers 118 and 158 and/or maintains same or similar amount of a first gap between the upper electrode 122 and the chuck 120 (FIG. 2A) and a second gap between the upper electrode 176 and the chuck 174. In this example, the pressure within the plasma chamber 118 is similar to the pressure within the plasma chamber 158 when the pressures are within a range of each other. Moreover, in this example, the temperature within the plasma chamber 118 is similar to the temperature within the plasma chamber 158 when the temperatures are within a range of each other. Also, in this example, the frequency of the x MHz RF generator of the plasma system 100 is similar to the frequency of the x MHz RF generator of the plasma system 150 when the frequencies are within a range of each other, the frequency of the y MHz RF generator of the plasma system 100 is similar to the frequency of the y MHz RF generator of the plasma system 150 when the frequencies are within a range of each other, and the frequency of the z MHz RF generator of the plasma system 100 is similar to the frequency of the z MHz RF generator of the plasma system 150 when the frequencies are within a range of each other. Further, in this example, the first gap is similar in amount to the second gap when the first and second gaps are within a range of each other.

In a variety of embodiments, similar chemistries are maintained within the plasma chambers 118 and 158 when an amount of each process gas is maintained within a pre-determined range in each of the plasma chambers 118 and 158. In some embodiments, similar chemistries are maintained within the plasma chambers 118 and 158 when each type of process gas in a combination of types of process gases is maintained within each of the plasma chambers 118 and 158. For example, both the plasma chambers 118 and 158 have similar chemistries when the plasma chambers 118 and 158 have a fluorine containing gas of the same amount or of amounts with a pre-determined range of each other. In various embodiments, similar chemistries are maintained within the plasma chambers 118 and 158 when types of process gases in the plasma chambers 118 and 158 are the same. For example, both the plasma chambers 118 and 158 have similar chemistries when the plasma chambers 118 and 158 have a fluorine containing gas.

It should be noted that in some embodiments, any number of RF generators are used in the plasma system 150.

Figure 4A:
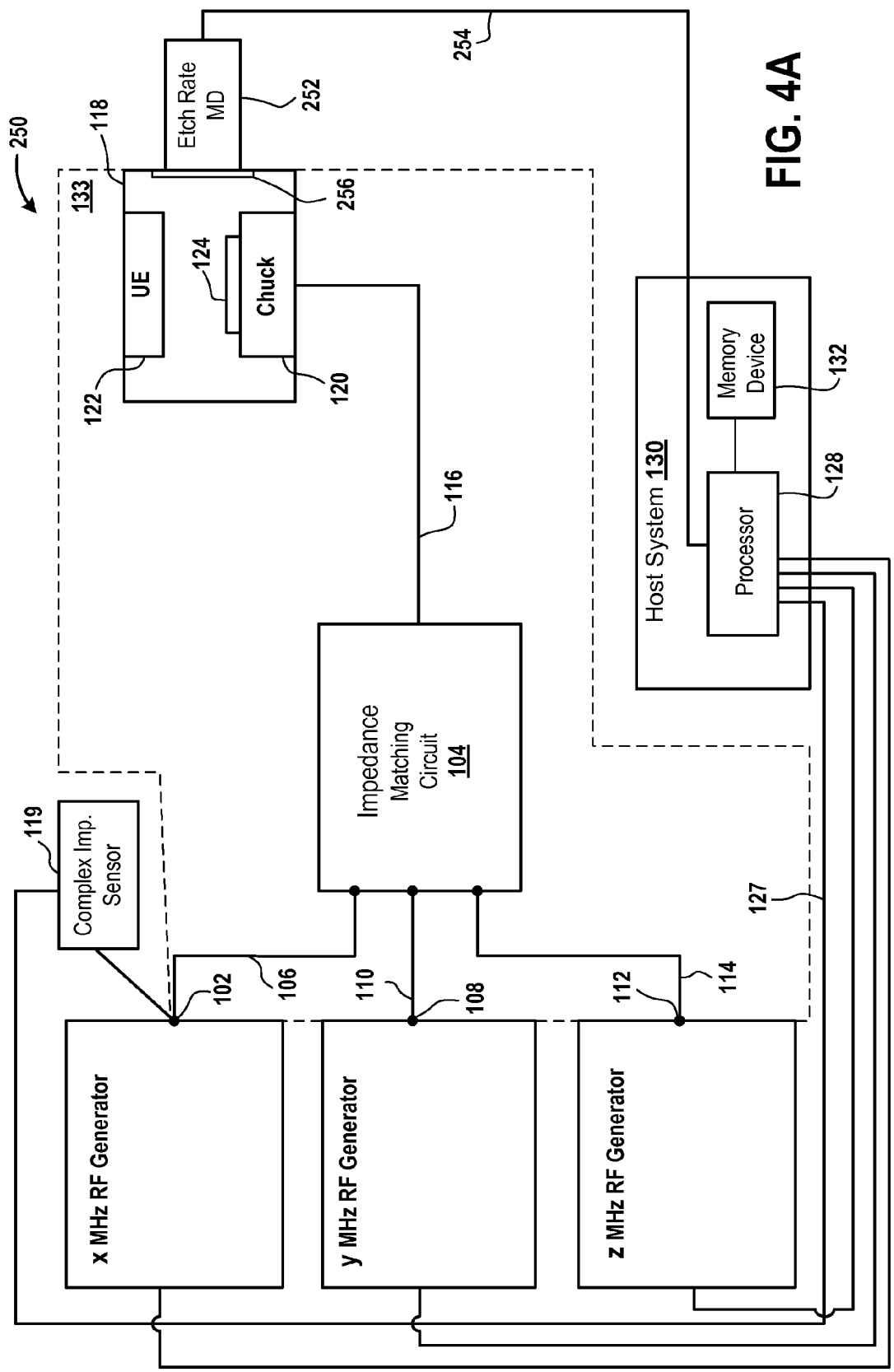
FIG. 4A is a block diagram of an embodiment of a plasma system for determining coefficients of voltage and current used to determine an etch rate, in accordance with some embodiments described in the present disclosure.

FIG. 4A is a block diagram of an embodiment of a plasma system 250 for determining coefficients of voltage and current used to determine an etch rate. The plasma system 250 includes the plasma system 100 (FIG. 2A) and an etch rate measurement device (ERMD) 252. The ERMD 252 is coupled to the processor 128 via a cable 254 and has a line of sight via a window 256 of the plasma chamber 118. The line of sight is directed into a space in which plasma is generated within the plasma chamber 118. For example, the ERMD 252 includes a spectrophotometer that monitors plasma within the plasma chamber 118 to measure intensity of radiation emitted by the plasma via the window 256. In some embodiments, the window 256 is made of a transparent material that allows light emitted by the plasma to pass through, e.g., glass. In various embodiments, the window 256 is a translucent window. The intensity is directly proportional to an etch rate of a layer of the dummy wafer 124 that is consumed by the plasma. The processor 128 receives the measured intensity via the cable 254 to determine the etch rate as directly proportional to the intensity. As another example, for a known recipe, the ERMD 252 measures a thickness of the dummy wafer 124 at a time tm1 and measures a thickness of the dummy wafer 124 at a time tm2, after time tm1 and after etching the dummy wafer 124. The ERMD 252 determines an etch rate ER2501 of the dummy wafer 124 as a ratio of a difference between the thickness at the time tm2 and the thickness at the time tm1 over a difference between the times tm2 and tm1. The etch rate ER2501 is provided by the ERMD 252 via the cable 254 to the processor 128. In some embodiments, instead of the ERMD 252 determining the etch rate ER2501, the processor 128 determines the etch rate ER 2501 from the measured intensity and provides the etch rate ER 2501 to the memory device 132 for storage. Examples of the known recipe include a pressure maintained within the plasma chamber 118, a temperature maintained within the plasma chamber 118, a gap between the upper electrode 122 and the chuck 120, an amount of power supplied by the x, y, and z MHz RF generators, frequencies of the x, y, and z MHz RF generators, or a combination thereof.

As described above, the complex impedance sensor 119 provides a measurement of a complex voltage and current to the processor 128 via the cable 127. The processor 128 receives the measurement of the complex voltage and current, extracts a voltage magnitude $V_3$ and a current magnitude $I_3$ from the measurement and provides the voltage $V_3$ magnitude and the current magnitude $I_3$ to the memory device 132 for storage. In some embodiments, the voltage magnitude $V_3$ is the same as the voltage magnitude $V_1$ that is determined by using the plasma system 100 and the current magnitude $I_3$ is the same as the current magnitude $I_1$ that is determined by using the plasma system 100. Moreover, the processor 128 determines an etch rate ER 2501 from the measured intensity and provides the etch rate ER 2501 to the memory device 132 for storage.

In some embodiments, instead of the plasma system 100, another plasma system is used to determine coefficients of voltage and coefficients of current that are used to determine an etch rate. For example, an impedance matching circuit that has the same structure and/or same function as that of the impedance matching circuit 104 and/or has a different identification number than that of the impedance matching circuit 104 is used instead of the impedance matching circuit 104. As another example, a cable that has the same structure and/or same function as that of the cable 106 and/or has a different identification number than that of the cable 106 is used instead of the cable 106. As yet another example, an RF transmission line that has the same structure and/or same function as that of the RF transmission line 116 and/or has a different identification number than that of the RF transmission line 116 is used instead of the RF transmission line 116. As another example, a plasma chamber that has the same structure and/or same function as that of the plasma chamber 118 and/or has a different identification number than that of the plasma chamber 118 is used instead of the plasma chamber 118.

In various embodiments, instead of the dummy wafer 124, a semiconductor wafer is used in the plasma system 250 when the x, y, and/or z MHz RF generators generate the RF signals to measure the intensity of plasma within the plasma chamber 118 and to measure complex voltage and current at the output 102.

In a number of embodiments, the plasma system 250 includes any number of RF generators.

Figure 4B:
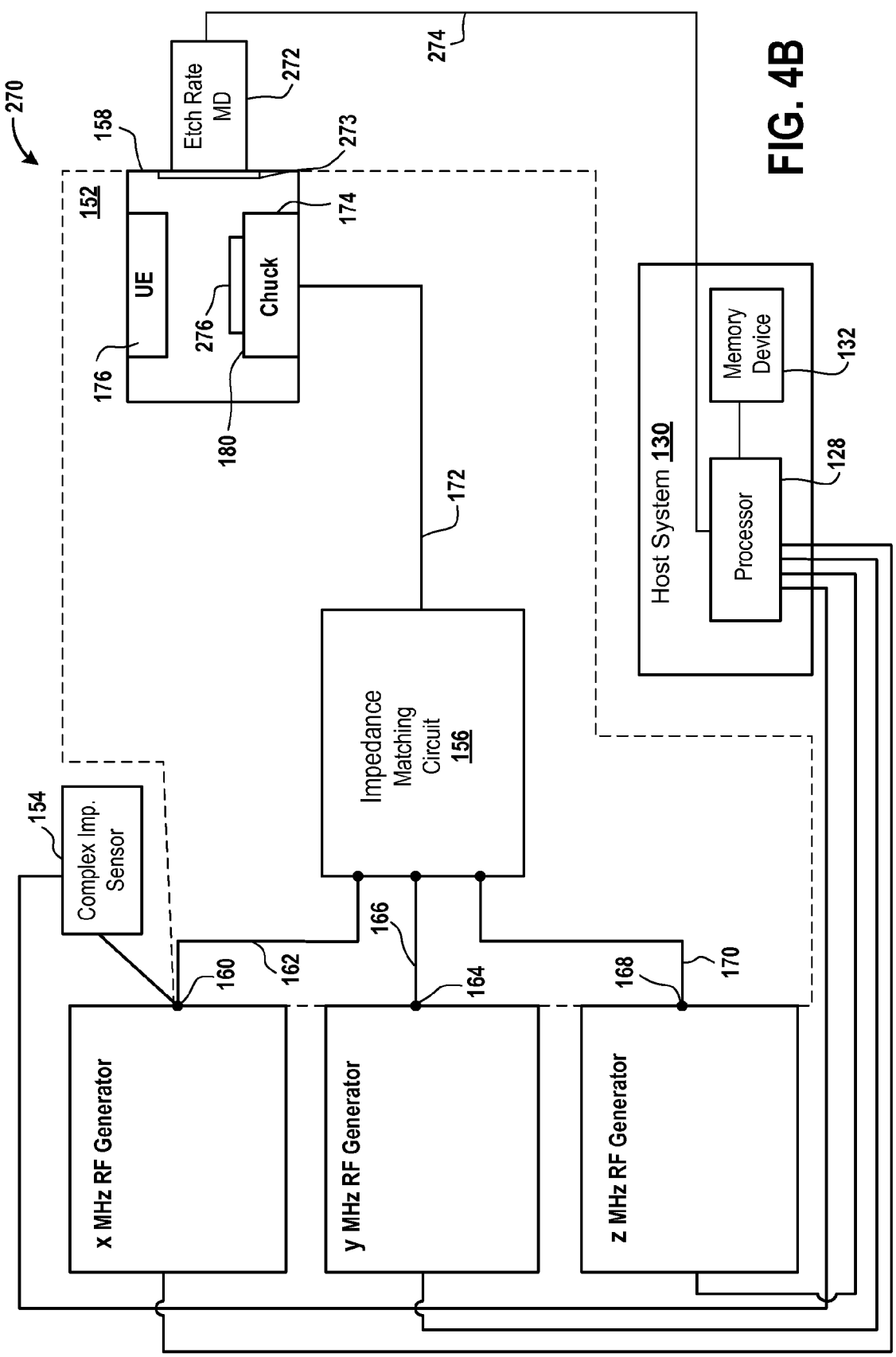
FIG. 4B is a block diagram of an embodiment of another plasma system for determining coefficients of voltage and current used to determine an etch rate, in accordance with various embodiments described in the present disclosure.

FIG. 4B is a block diagram of an embodiment of a plasma system 270 for determining coefficients of voltage and current used to determine an etch rate. The plasma system 270 is the same as the plasma system 150 (FIG. 2B) except that a dummy wafer 276 is used in the plasma chamber 158 instead of the semiconductor wafer 178 (FIG. 2B). Moreover, the plasma system 270 includes an ERMD 272, which measures an etch rate ER2701. The etch rate ER2701 is provided by the ERMD 272 via a cable 274 to the processor 128.

In various embodiments, instead of determining the etch rate ERMD2701, the ERMD 272 measures intensity of light emitted by plasma generated within the plasma chamber 158 via a window 273 of the plasma chamber 158 and provides the measured intensity to the processor 128 via the cable 274. The cable 274 couples the ERMD 272 to the processor 128. In some embodiments, the processor 128 determines the etch rate ER 2701 as being directly proportional to the measured intensity and provides the etch rate ER 2701 to the memory device 132 for storage.

The processor 128 also receives the complex voltage and current that is measured at the output 160 by the complex impedance sensor 154, extracts a voltage magnitude $V_4$ and a current magnitude $I_4$ from the complex voltage and current, and provides the voltage magnitude $V_4$ and the current magnitude $I_4$ to the memory device 132 for storage. In some embodiments, the voltage magnitude $V_4$ is equal to the voltage magnitude $V_2$ and the current magnitude $I_4$ is equal to the current magnitude $I_2$.

The processor 128 further determines coefficients of the voltage $V_1$ and of the current $I_1$ based on the etch rate ER 2501 determined using the plasma system 250 (FIG. 4A), the etch rate ER 2701, the voltages $V_3$ and $V_4$, and the currents $I_3$ and $I_4$. To illustrate, the processor 128 determines the coefficients $C_{11}$ and $C_{12}$ by solving for the coefficients in the etch rate ER 2501 that is equal to $C_{11}V_3+C_{12}I_3$ and in the etch rate ER 2701 that is equal to $C_{11}V_4+C_{12}I_4$.

As another example, the processor 128 determines the coefficients $C_{21}$, $C_{22}$, $C_{23}$, $C_{24}$, and $C_{25}$ of the voltage $V_1$ and of the current $I_1$ based on the etch rate ER 2501 determined using the plasma system 250 (FIG. 4A), the etch rate ER 2701, three additional etch rates determined using three additional plasma systems, the voltages $V_3$ and $V_4$, and three additional voltages $V_5$, $V_6$, and $V_7$ determined using the three additional plasma systems, the currents $I_3$ and $I_4$, and three additional currents $I_5$, $I_6$, and $I_7$ determined using the three additional plasma systems. To illustrate, the processor 128 determines the coefficients $C_{21}$, $C_{22}$, $C_{23}$, $C_{24}$, and $C_{25}$ by solving for the coefficients in the etch rate ER 2501 that is equal to $C_{21}V_3+C_{22}I_3+C_{23}V_3^2+C_{24}V_3I_3+C_{25}I_3^2$, the etch rate 2701 that is equal to $C_{21}V_4+C_{22}I_4+C_{23}V_4^2+C_{24}V_4I_4+C_{25}I_4^2$, one of the three additional etch rates that is equal to $C_{21}V_5+C_{22}I_5+C_{23}V_5^2+C_{24}V_5I_5+C_{25}I_5^2$, a second one of the three additional etch rates that is equal to $C_{21}V_6+C_{22}I_6+C_{23}V_6^2+C_{24}V_6I_6+C_{25}I_6^2$, and a third one of the three additional etch rates that is equal to $C_{21}V_7+C_{22}I_7+C_{23}V_7^2+C_{24}V_1I_7+C_{25}I_7^2$.

In some embodiments, instead of the plasma system 270, another plasma system is used to determine coefficients of voltage and coefficients of current that are used to determine an etch rate. For example, an impedance matching circuit that has the same structure and/or same function as that of the impedance matching circuit 156 and/or has a different identification number than that of the impedance matching circuit 156 is used instead of the impedance matching circuit 156. As another example, a cable that has the same structure and/or same function as that of the cable 162 and/or has a different identification number than that of the cable 162 is used instead of the cable 162. As yet another example, an RF transmission line that has the same structure and/or same function as that of the RF transmission line 172 and/or has a different identification number than that of the RF transmission line 172 is used instead of the RF transmission line 172. As another example, a plasma chamber that has the same structure and/or same function as that of the plasma chamber 158 and/or has a different identification number than that of the plasma chamber 158 is used instead of the plasma chamber 158.

In some embodiments, any number of plasma systems are used to determine unknowns, e.g., coefficients, etc., of an etch rate. For example, a number of unknowns is equal to a number of plasma systems that are used to determine the unknowns.

In various embodiments, instead of the dummy wafer 276, a semiconductor wafer is used in the plasma system 270 when the x, y, and/or z MHz RF generators generate the RF signals to measure the intensity of plasma within the plasma chamber 158 and to measure complex voltage and current at the output 160.

Figure 5:
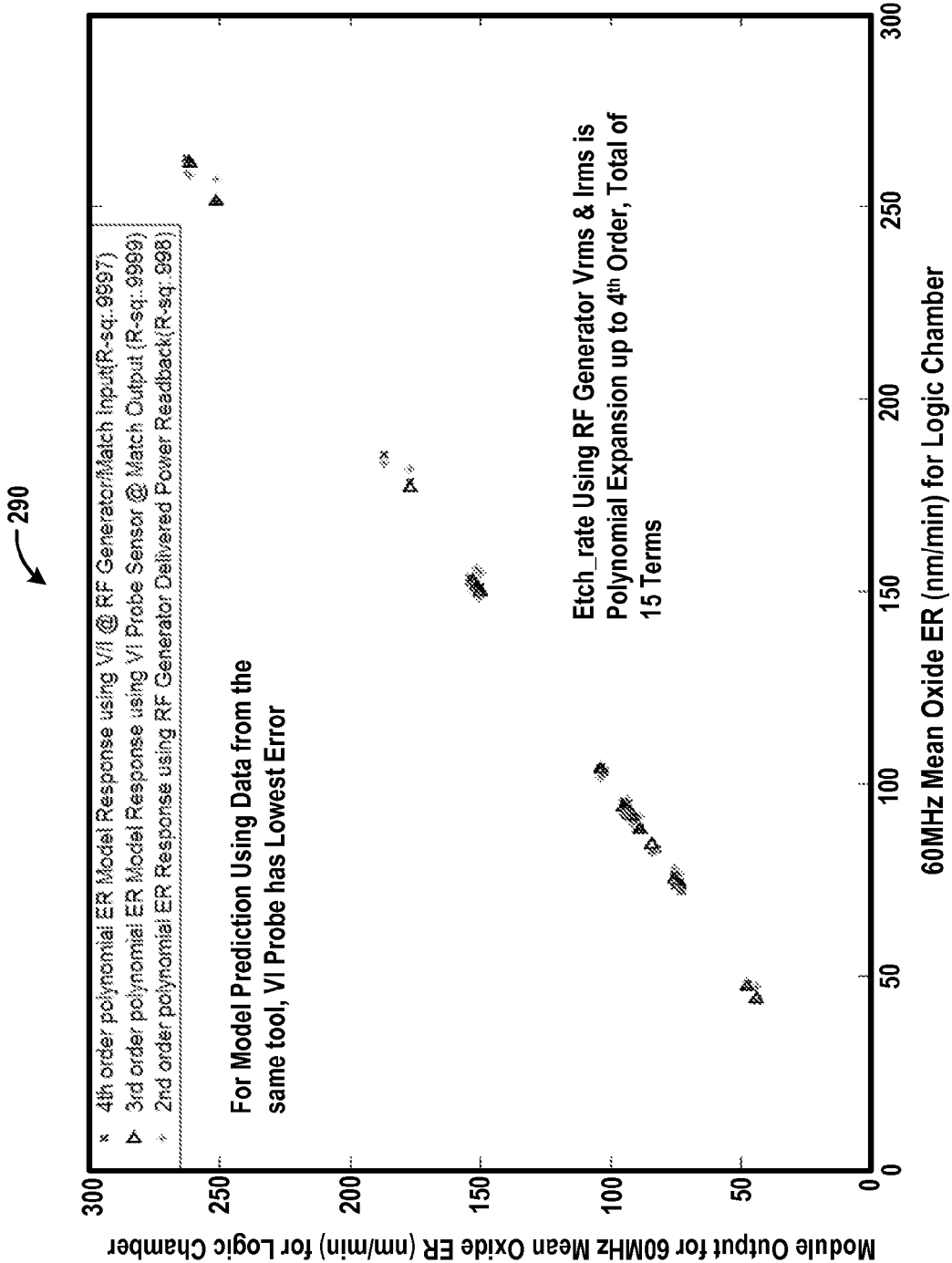
FIG. 5 is an embodiment of a graph that plots mean values of an etch rate model versus a mean value of measured etch rate, determined using an etch rate measurement device (ERMD), when a z megahertz (MHz) RF generator is operational and x and y MHz RF generators are nonoperational, in accordance with several embodiments described in the present disclosure.

FIG. 5 is an embodiment of a graph 290 that plots values of an etch rate model, e.g., a second order polynomial etch rate, a third order polynomial etch rate, a fourth order polynomial etch rate, etc., versus values of measured etch rate, determined using an ERMD when the z MHz RF generator is operational, e.g., supplying power, working, functional, etc., and the x and y MHz RF generators are nonoperational, e.g., not supplying power, not working, not functional, etc. The measured etch rate determined using an ERMD is plotted along an x-axis and the etch rate model is plotted along a y-axis. A best fit straight line may be drawn through various points for each etch rate model of the graph 290. As shown, the second order polynomial etch rate model in the graph 290 has a coefficient of determination ($R^2$) of 0.9998, the third order polynomial etch rate model in the graph 290 has an $R^2$ of 0.9999 and the fourth order polynomial etch rate model in the graph 290 has an $R^2$ of 0.9997. The greater the $R^2$, the more accurate mean values of an etch rate model.

Figure 6:
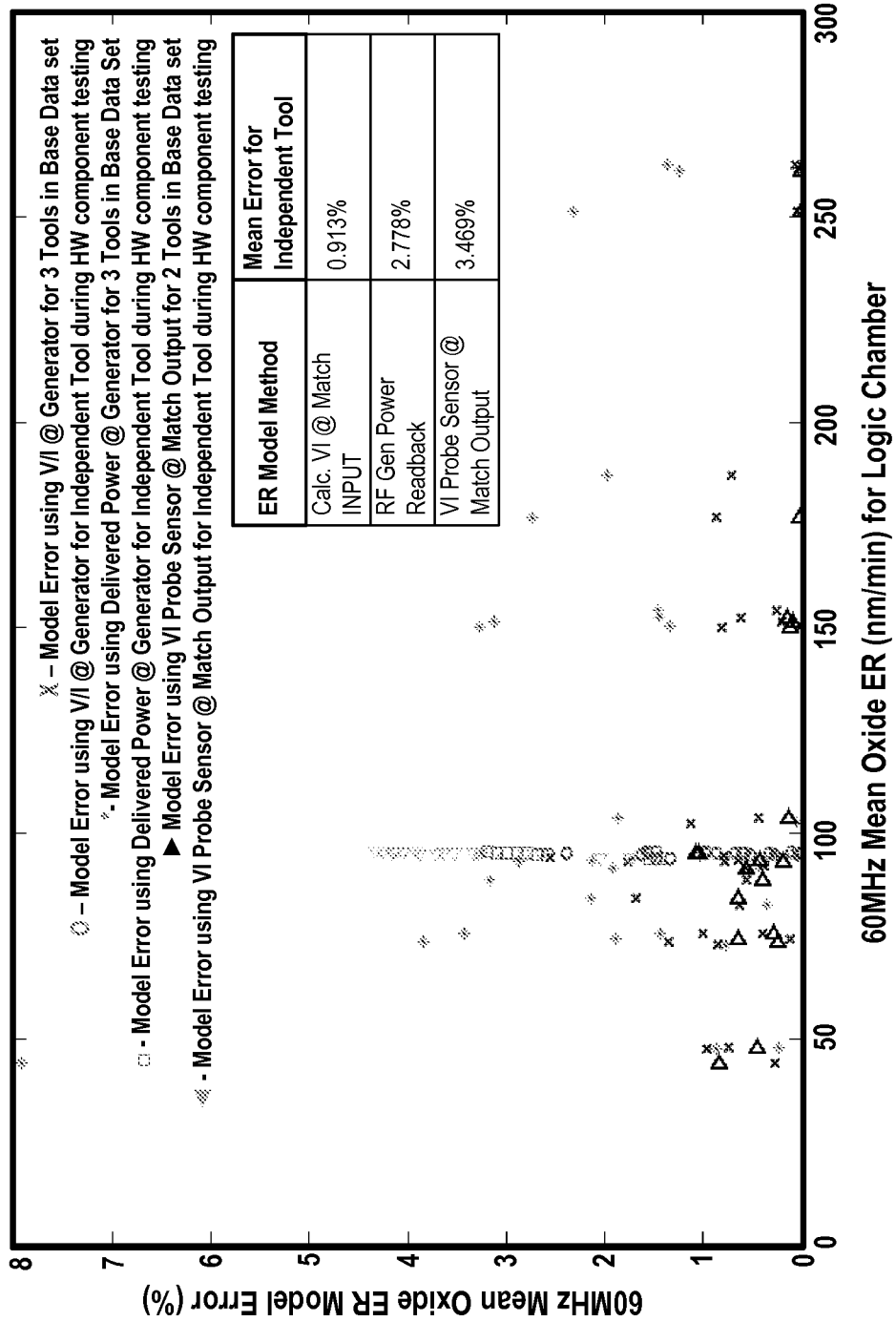
FIG. 6 is an embodiment of a graph that plots an error in mean values of an etch rate model versus a mean etch rate when the z MHz RF generator is operational and the x and y MHz RF generators are nonoperational, in accordance with some embodiments described in the present disclosure.

FIG. 6 is an embodiment of a graph 292 that plots errors in values of an etch rate, versus modeled etch rates when the z MHz RF generator is operational and the x and y MHz RF generators are nonoperational. The "x"s, asterisks "*", and triangles that have a vertex pointing to the right side in the graph 292 represent errors in values of etch rate models versus the values of the etch rate models when two or more different tools are used. The circles, squares, and triangles that have a vertex that point to the left side in the graph 292 represent errors in values of etch rate models versus the values when an independent tool other than the two or more different tools is used.

Figure 7A:
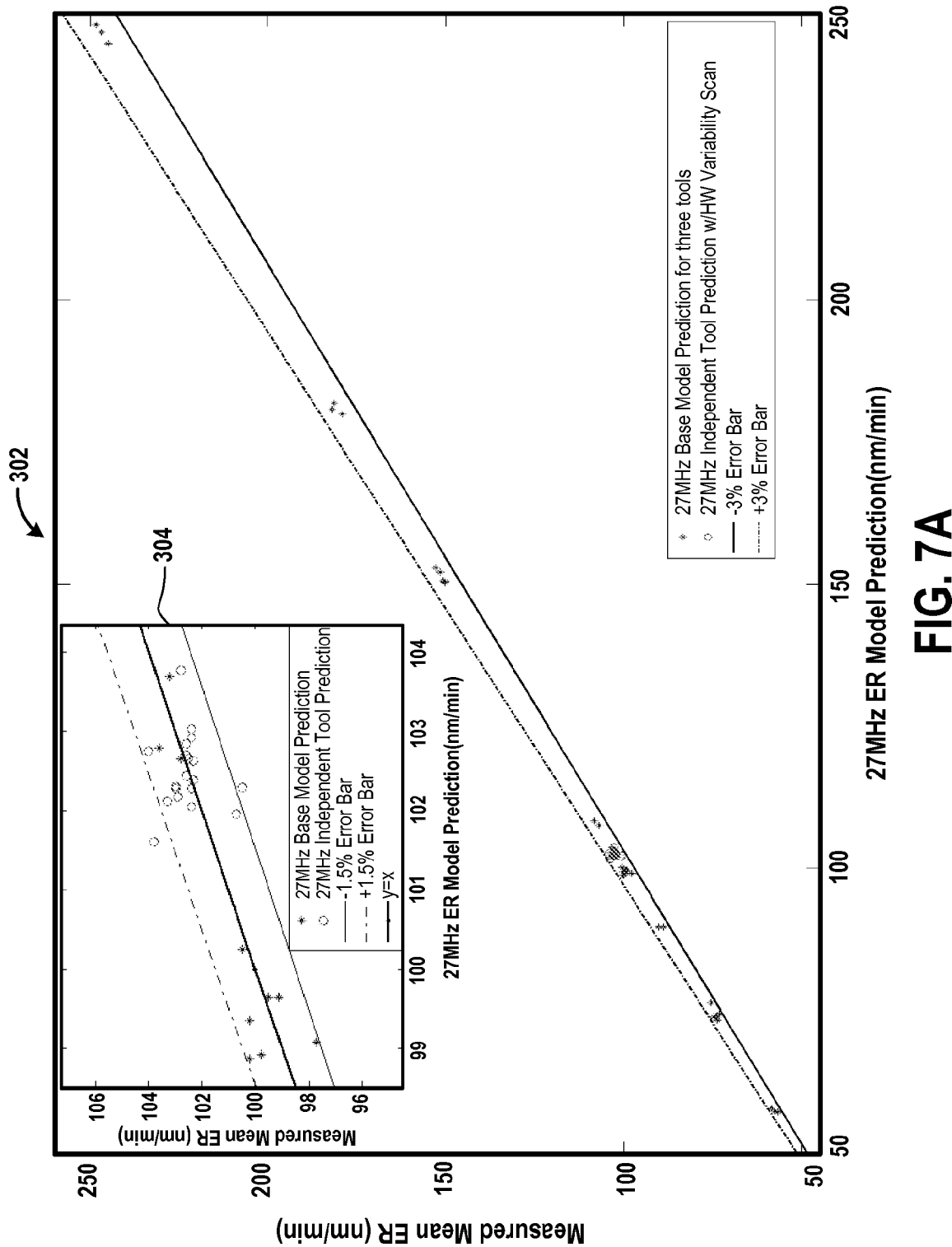
FIG. 7A shows embodiments of graphs that plot mean measured etch rates versus modeled etch rates to illustrate a generally linear relationship between the measured and modeled etch rates when a 27 megahertz RF generator is operational, in accordance with some embodiments described in the present disclosure.

FIG. 7A shows embodiments of a graph 302 and a graph 304. Each graph 302 and 304 plots measured etch rates, which are etch rates measured using an ERMD, versus modeled etch rates, when the y MHz RF generator is operational and the x and z MHz RF generators are nonoperational. The measured etch rates are plotted on a y-axis and the modeled etch rates is plotted on an x-axis. The asterisks "*" in the graph 302 represent measured etch rates versus modeled etch rates when three different tools are used. The circles in the graph 302 represent measured etch rates versus modeled etch rates when an independent tool other than the three tools is used. It should be noted that the asterisks "*" of the graph 302 generally fit to a straight line. The graph 304 is a zoom-in of a portion of the graph 302.

Figure 7B:
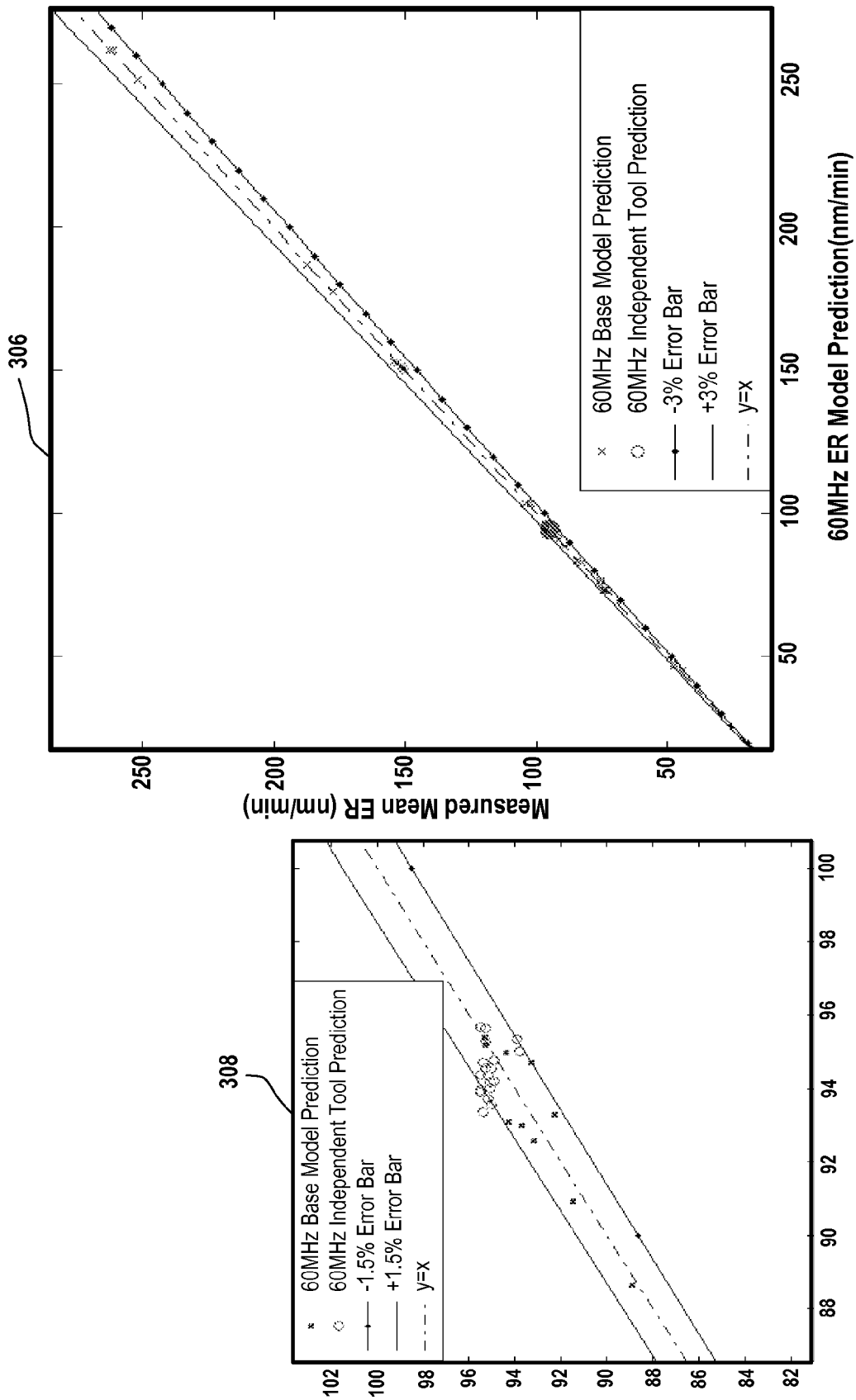
FIG. 7B shows embodiments of graphs that plot mean measured etch rates versus modeled etch rates to illustrate a generally linear relationship between the measured and modeled etch rates when a 60 megahertz RF generator is operational, in accordance with some embodiments described in the present disclosure.

FIG. 7B shows embodiments of a graph 306 and a graph 308. Each graph 306 and 308 plots measured etch rates versus modeled etch rates, when the z MHz RF generator is operational and the x and y MHz RF generators are nonoperational. The asterisks "*" in the graph 306 represent measured etch rates versus modeled etch rates when three different tools are used. The circles in the graph 306 represent measured etch rates versus modeled etch rates when an independent tool other than the three tools is used. It should be noted that the asterisks "*" of the graph 306 generally fit to a straight line. The graph 308 is a zoom-in of a portion of the graph 306.

In some embodiments, instead of connecting a complex impedance sensor to an output of an RF generator, the complex impedance sensor is coupled to an input of an impedance matching circuit that is connected to the output of the RF generator.

Although the above-described embodiments are described in terms of etch rate, in various embodiments, a sputtering rate can be used instead of the etch rate. For example, in some embodiments, sputtering rate and etch rate are used interchangeably herein.

It is noted that although the above embodiments are described with reference to complex voltage and current at an output of an RF generator, the above embodiments apply equally as well to complex voltage and current at an input of the impedance matching circuit 104 (FIGS. 2A & 2B) and to complex voltage and current at an input of the impedance matching circuit 156 (FIGS. 4A & 4B). For example, the complex voltage and current measured at the output 102 is the same as the complex voltage and current at the input 161 of the impedance matching circuit 104 (FIGS. 2A & 4A). As another example, the complex voltage and current measured at the output 160 (FIGS. 2B & 4B) is the same as the complex voltage and current at the input 161 of the impedance matching circuit 104 (FIGS. 2B & 4B). As yet another example, a modeled etch rate determined based on the complex voltage and current determined at the output 102 is the same as a modeled etch rate at the input 161.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an ICP reactor, a TCP reactor, conductor tools, dielectric tools, a plasma chamber including an ECR reactor, etc. For example, the x MHz RF generator, the y MHz RF generator, and the z MHz RF generator are coupled to an inductor within the ICP plasma chamber via an impedance matching circuit.

It is also noted that although the operations above are described as being performed by the processor 128 (FIGS. 2A, 2B, 4A, and 4B), in some embodiments, the operations may be performed by one or more processors of the host system 130 or by multiple processors of multiple host systems or by a combination of a DSP of an RF generator and a processor of a host system.

It should be noted that although the above-described embodiments relate to providing an RF signal to the lower electrode of a chuck of a plasma chamber, and grounding an upper electrode of the plasma chamber, in several embodiments, the RF signal is provided to the upper electrode while the lower electrode is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method comprising:
receiving a voltage and a current measured at an output of a radio frequency (RF) generator of a first plasma system;
calculating a sum of a first term, a second term, and a third term, wherein the first term is a first product of a coefficient and a function of the voltage, the second term is a second product of a coefficient and a function of the current, and the third term is a third product of a coefficient, a function of the voltage, and a function of the current;
determining the sum to be the etch rate associated with the first plasma system; and
adjusting power output from an RF generator of a second plasma system to achieve the etch rate associated with the first plasma system,
wherein the method is executed by a processor.

2. The method of claim 1, wherein the RF generator of the first plasma system is coupled to an impedance matching circuit via a cable, and wherein the impedance matching circuit is coupled to a plasma chamber via an RF transmission line.

3. The method of claim 1, wherein the function of the voltage in the first product or the third product includes a mathematical power function of the voltage measured at the output of the RF generator of the first plasma system, and the function of the current in the second product or the third product includes a mathematical power function of the current measured at the output of the RF generator of the first plasma system.

4. The method of claim 1, wherein receiving the voltage and the current measured at the output of the RF generator of the first plasma system is performed using a dummy wafer in a plasma chamber of the first plasma system.

5. The method of claim 1, wherein the output of the RF generator of the first plasma system is coupled to an input of an impedance matching circuit, wherein the output facilitates a transfer of an RF signal to a plasma chamber via the impedance matching circuit.

6. The method of claim 1, wherein adjusting the power output from the RF generator of the second plasma system is performed when the second plasma system is used to etch a semiconductor wafer.

7. The method of claim 1, wherein adjusting the power includes increasing or decreasing the power output from the RF generator of the second plasma system.

8. The method of claim 1, wherein the first plasma system includes a tool that is identical in function to a tool of the second plasma system and has a different identification than that of the second plasma system.

9. The method of claim 1, wherein the first plasma system includes a tool that is identical in structure to a tool of the second plasma system and has a different identification than that of the second plasma system.

10. The method of claim 1, wherein the first plasma system includes a tool that is identical in structure and function to a tool of the second plasma system and has a different identification than that of the second plasma system.

11. The method of claim 1, wherein the sum is a Taylor series.

12. A method comprising:
receiving a voltage and a current measured at a first time at an output of a radio frequency (RF) generator of a plasma system;
calculating a sum of a first term, a second term, and a third term, wherein the first term is a first product of a coefficient and a function of the voltage, the second term is a second product of a coefficient and a function of the current, and the third term is a third product of a coefficient, a function of the voltage, and a function of the current;
determining the sum to be the etch rate associated with the plasma system; and
adjusting power output at a second time from the RF generator of the plasma system to achieve the etch rate,
wherein the method is executed by a processor.

13. The method of claim 12, wherein the output of the RF generator is coupled to an input of an impedance matching circuit, wherein the output is used to facilitate transfer of an RF signal to a plasma chamber via the impedance matching circuit.

14. The method of claim 12, wherein the second time occurs after the first time.

15. The method of claim 12, wherein the function of the voltage in the first product or the third product includes a mathematical power function of the voltage measured at the first time, and the function of the current in the second product or the third product includes a mathematical power function of the current measured at the first time.

16. The method of claim 12, wherein receiving the voltage and the current measured at the first time at the output of the RF generator of the plasma system is performed using a dummy wafer in a plasma chamber of the plasma system.

17. The method of claim 12, wherein the output of the RF generator of the plasma system is coupled to an input of an impedance matching circuit, the impedance matching circuit used to match an impedance of a plasma chamber of the plasma system and an RF transmission line coupled to the plasma chamber with an impedance of an RF cable coupled to the RF generator and the RF generator.

18. The method of claim 12, wherein adjusting the power at the second time at the output of the RF generator of the plasma system is performed when the plasma system is used to etch a semiconductor wafer.

19. A plasma system for modeling an etch rate, the plasma system comprising:
a radio frequency (RF) generator for generating an RF signal, the RF generator including an output for facilitating transfer of the RF signal;
a complex impedance sensor coupled to the output of the RF generator for measuring a complex voltage and current of the RF signal;
a plasma chamber for generating plasma when the RF signal is received;
an impedance matching circuit coupled to the RF generator via a cable and coupled to the plasma chamber via an RF transmission line;
a processor coupled to the complex impedance sensor for receiving the measurement of the complex voltage and current from the complex impedance sensor, the processor for:
receiving a voltage and a current measured at an output of an RF generator of a second plasma system;
calculating a sum of a first term, a second term, and a third term, wherein the first term is a first product of a coefficient and a function of the voltage measured at the output of the second plasma system, and the second term is a second product of a coefficient and a function of the current measured at the output of the RF generator of the second plasma system, and the third term is a third product of a coefficient, a function of the voltage measured at the output of the RF generator of the second plasma system, and a function of the current measured at the output of the RF generator of the second plasma system;
determining the sum to be the etch rate associated with the second plasma system; and
adjusting power at the output of the RF generator of the first plasma system to achieve the etch rate associated with the second plasma system, wherein adjusting the power is based on the complex voltage and current.

20. The plasma system of claim 19, wherein the first plasma system includes a tool that is identical in function to a tool of the second plasma system and has a different identification than that of the second plasma system.

* * * * *